(12) United States Patent
McWhirter et al.

(10) Patent No.: US 9,502,145 B2
(45) Date of Patent: Nov. 22, 2016

(54) NUCLEAR REACTOR OPERATION AND SIMULATION

(75) Inventors: Jon D. McWhirter, Newcastle, WA (US); Charles Whitmer, North Bend, WA (US); Lowell L. Wood, Jr., Bellevue, WA (US); George B. Zimmerman, Lafayette, CA (US)

(73) Assignee: TerraPower, LLC, Bellevue, WA (US)

( * ) Notice: Subject to any disclaimer, the term of this patent is extended or adjusted under 35 U.S.C. 154(b) by 2017 days.

(21) Appl. No.: 12/565,402

(22) Filed: Sep. 23, 2009

(65) Prior Publication Data

US 2011/0069801 A1 Mar. 24, 2011

(51) Int. Cl.
G21C 17/00 (2006.01)
G21D 3/00 (2006.01)
G21C 1/02 (2006.01)
G21C 5/00 (2006.01)
G21C 7/00 (2006.01)

(52) U.S. Cl.
CPC ............... *G21D 3/001* (2013.01); *G21C 1/026* (2013.01); *G21C 5/00* (2013.01); *G21C 17/00* (2013.01); *G21C 7/00* (2013.01); *G21D 2003/002* (2013.01); *Y02E 30/34* (2013.01); *Y02E 30/39* (2013.01)

(58) Field of Classification Search
USPC ................................................. 376/245, 463
See application file for complete search history.

(56) References Cited

U.S. PATENT DOCUMENTS 3,079,315 A 2/1963 Le Baud et al.
4,508,677 A 4/1985 Craig et al.
5,158,738 A 10/1992 Trouble et al.
5,774,514 A 6/1998 Rubbia
2004/0009455 A1* 1/2004 Chiang et al. ................ 434/218
2008/0123797 A1 5/2008 Hyde et al.
2008/0240333 A1 10/2008 Ahlfeld et al.
(Continued)

FOREIGN PATENT DOCUMENTS

JP S57108694 A 7/1982
JP 2004053599 A 2/2004
JP 2005106540 A 4/2005

OTHER PUBLICATIONS

Teller et al., "Completely Automated Nuclear Power Reactors for Long-Term Operation: III. Enabling Technology for Large-Scale, Low-Risk Affordable Nuclear Electricity", Nov. 30, 2003, U.S. Department of Energy, Lawrence Livermore National Laboratory, p. 1-59.*

(Continued)

*Primary Examiner* — Marshall O'Connor
(74) *Attorney, Agent, or Firm* — Wolf, Greenfield & Sacks, P.C.

(57) ABSTRACT

Illustrative embodiments provide for the operation and simulation of the operation of fission reactors. Illustrative embodiments and aspects include, without limitation, nuclear fission reactors and reactor modules, including modular nuclear fission reactors and reactor modules, nuclear fission deflagration wave reactors and reactor modules, modular nuclear fission deflagration wave reactors and modules, methods of operating nuclear reactors and modules including the aforementioned, methods of simulating operating nuclear reactors and modules including the aforementioned, and the like.

39 Claims, 19 Drawing Sheets

(56) References Cited

U.S. PATENT DOCUMENTS

2009/0080588 A1    3/2009  Ahlfeld et al.

OTHER PUBLICATIONS

PCT International Search Report; International Application No. PCT/US 10/02607; Jun. 14, 2011; pp. 1-2.
Teller E. et al; "Completely Automated Nuclear Power Reactors for Long-Term Operation: III. Enabling Technology for Large-Scale, Low-Risk Affordable Nuclear Electricity"; Energy, The International Journal; bearing a date of Nov. 30, 2003; pp. 1-57; Lawrence Livermore Laboratory, U.S. Department of Energy.
W. B. Wilson et al.; "A Manual for CINDER '90 Version 07.4 Codes and Data LA-UR-07-8412"; Los Alamos National Laboratory; Dec. 2008; 210 pages.
X-5 Monte Carlo Team; "MCNP—A General Monte Carlo N-Particle Transport Code, Version 5, vol. 1: Overview and Theory"; Los Alamos National Laboratory; Apr. 24, 2003 (Revised Feb. 1, 2008); 416 pages.
Japanese Office Action; App. No. 201080053030; Sep. 30, 2014; 6 pages (pp. 1-3 are a machine translation).
Peoples Republic of China First Office Action; App. No. 201080050309; Apr. 15, 2014; 21 pages (pp. 1-12 are a machine translation).
Xie, Zhongsheng; "Nuclear Reactor Physical Analysis"; Atomic Energy Press of XI'An Jiaotong University Press; Jul. 2004; Version 1 (no translation available).

\* cited by examiner

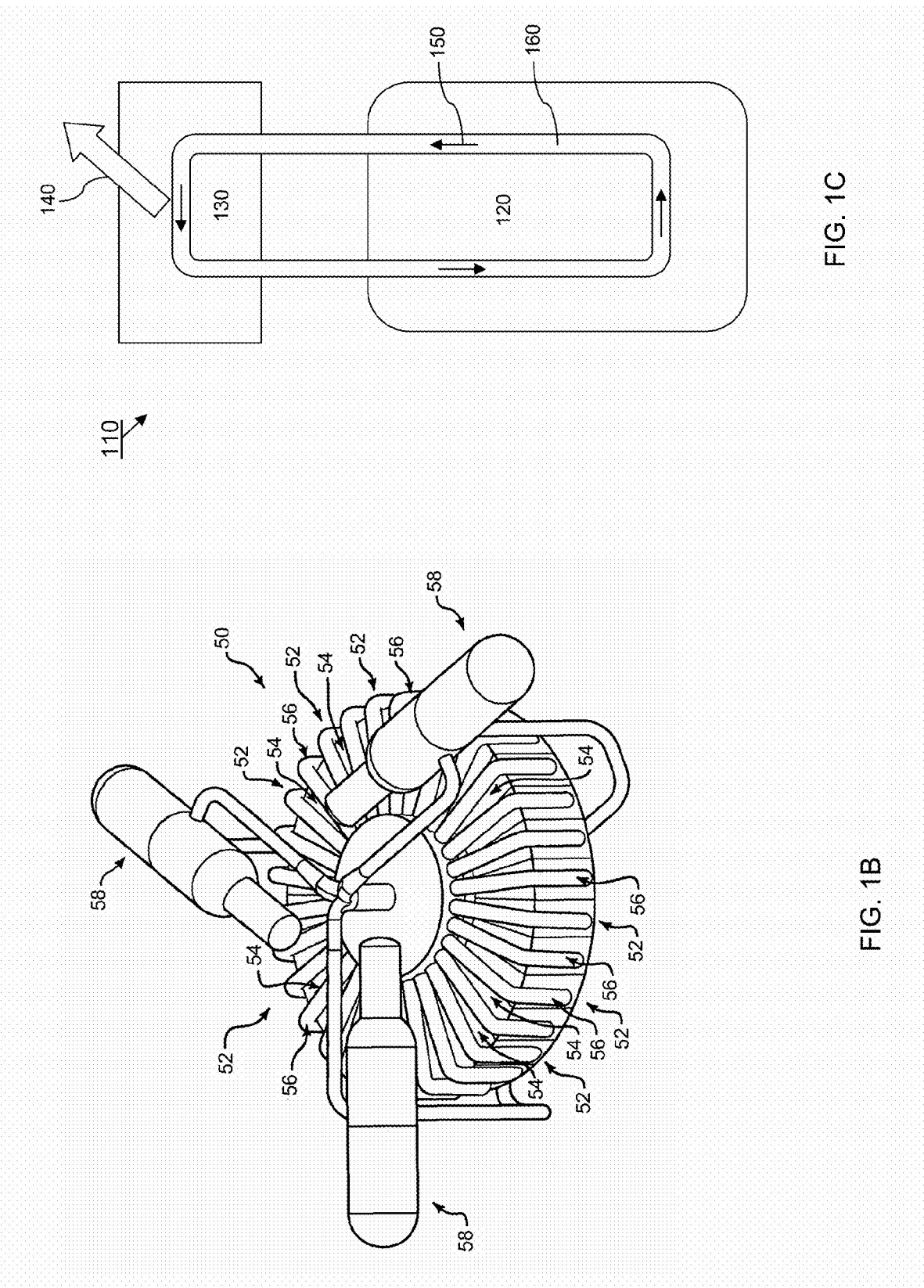

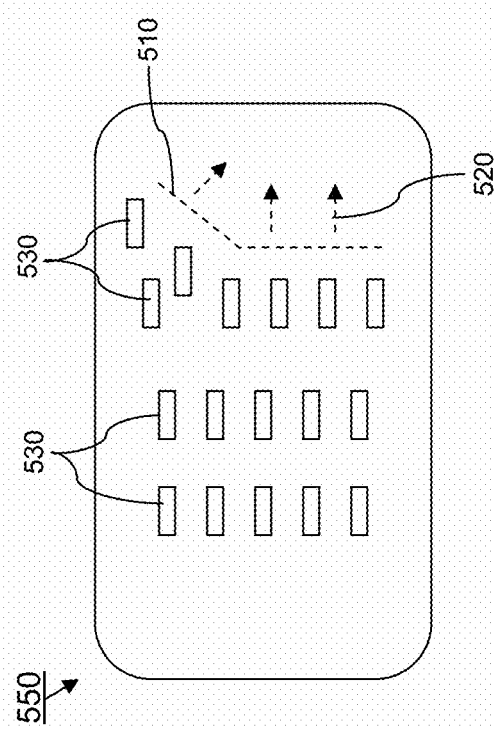
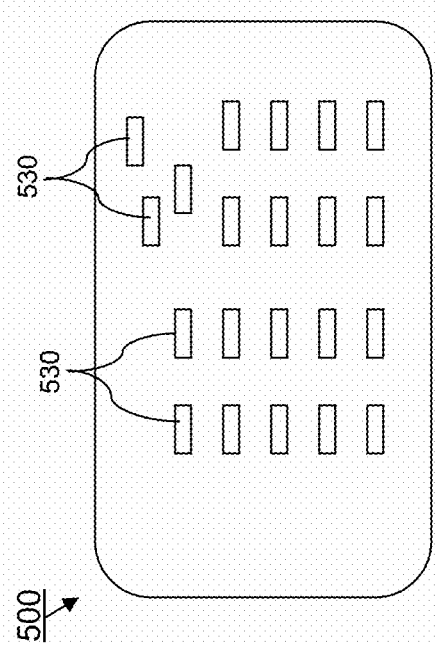

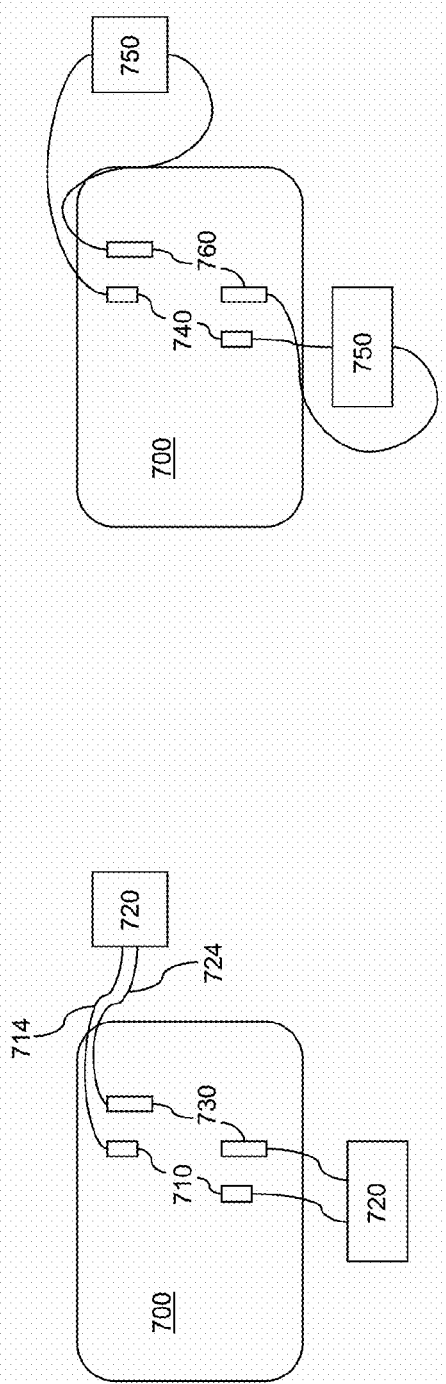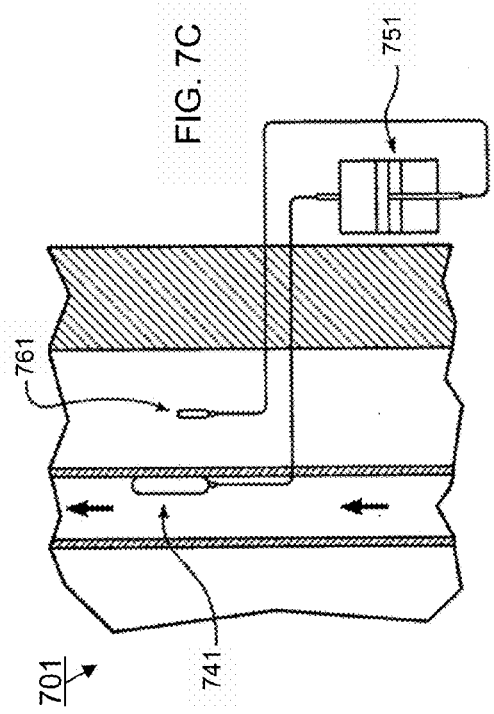

1700

(B)

↓

1705 — Transfer material(s) from/to a second cell at the transfer rate(s) approximately equivalent to the move rate(s) of the materials

1805 — Transfer material(s) to the second cell at transfer rate(s) approximately equivalent to the move rate(s) of the materials

↓

1810 — Determine a second (set of) move rate(s) for material(s) in the second cell

↓

1815 — Make further adjustment to average rate(s) of change in the second cell based on the second (set of) move rate(s) of the material(s).

↓

1820 — Transfer material(s) from the second cell to a third cell at approximately the second (set of) move rate(s)

↓

1825 — Determine move rate(s) for material(s) in the third cell

↓

1830 — Adjust average rate(s) of change for material(s) in the third cell by the second (set of) move rates for the second cell and/or the determined move rates of the third cell

↓

1835 — Transfer material(s) from the third cell to a fourth cell at approximately the determined move rate(s) of the third cell

↓

1840 — Determine move rate(s) for material(s) in the fourth cell

↓

1845 — Adjust average rate(s) of change for material(s) in the fourth cell by the determined move rate(s) of the third cell and/or the determined move rates of the fourth cell

↓

1850 — Transfer material(s) from the fourth cell to the first cell at approximately the determined move rates of the fourth cell

FIG. 18

NUCLEAR REACTOR OPERATION AND SIMULATION

BACKGROUND

The present application relates to nuclear fission reactors, and systems, applications, and apparatuses related thereto.

SUMMARY

Illustrative embodiments provide for the operation and simulation of the operation of fission reactors. Illustrative embodiments and aspects include, without limitation, nuclear fission reactors and reactor modules, including modular nuclear fission reactors and reactor modules, nuclear fission deflagration wave reactors and reactor modules, modular nuclear fission deflagration wave reactors and modules, methods of operating nuclear reactors and modules including the aforementioned, methods of simulating operating nuclear reactors and modules including the aforementioned, and the like.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 1B is a perspective view in schematic form of an illustrative modular nuclear fission deflagration wave reactor;

FIG. 1C schematically illustrates exemplary fluid cooling;

FIG. 5A and FIG. 5B schematically illustrate exemplary neutron affecting structures;

FIGS. 7A through 7C schematically illustrate exemplary temperature control of nuclear reactivity;

FIGS. 11-22 are flowcharts of illustrative methods associated for simulating and/or controlling nuclear reactors.

Figure 1A:
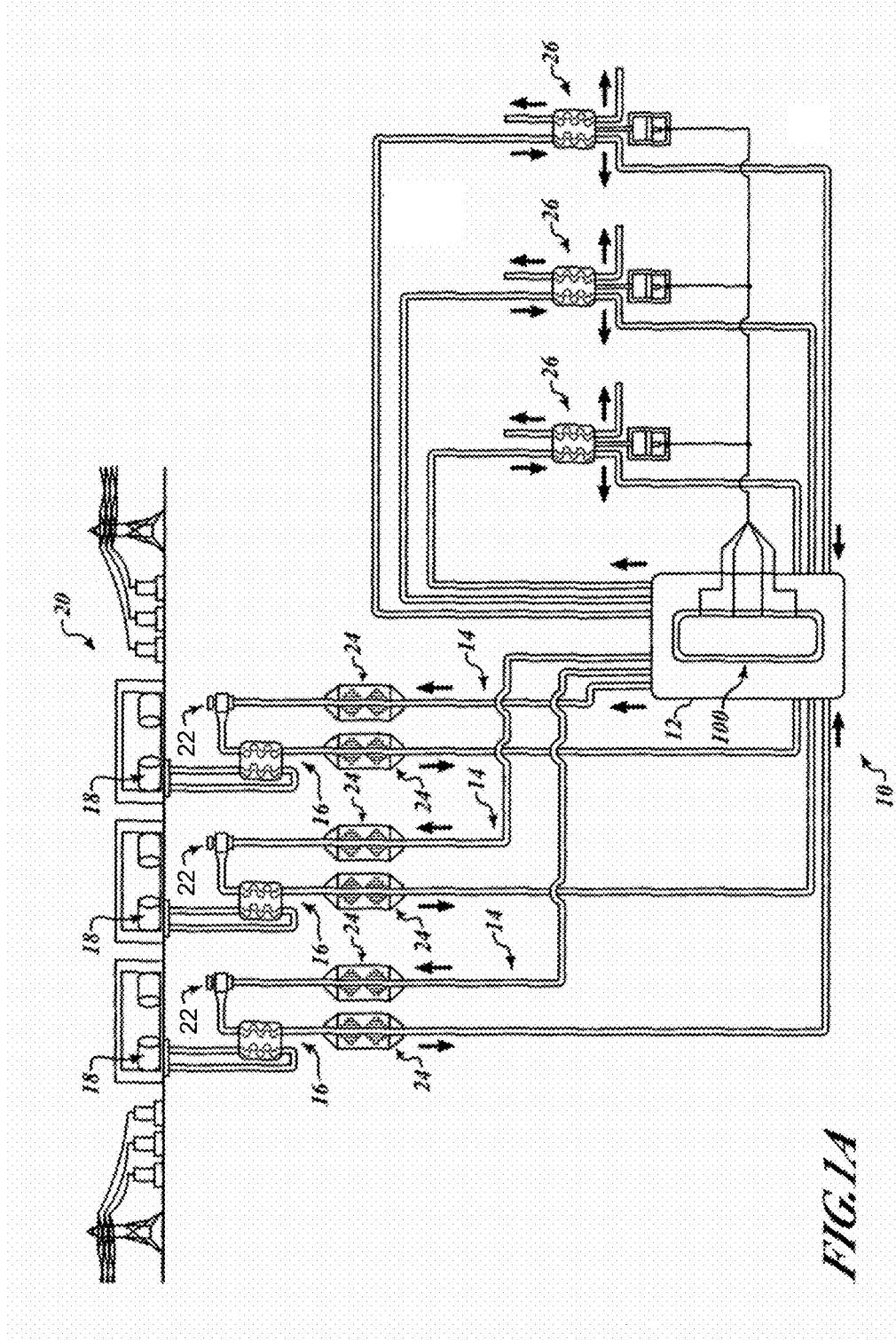
FIG. 1A schematically illustrates an exemplary nuclear fission reactor.

The present invention will now be described with reference to the accompanying drawings. In the drawings, like reference numbers may indicate identical or similar elements. Additionally, the left-most digit(s) of a reference number may identify the drawing in which the reference number first appears.

DETAILED DESCRIPTION

Introduction

In the following detailed description, reference is made to the accompanying drawings, which form a part hereof. In the drawings, generally similar symbols identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be used in a variety of other applications. The scope of the invention is not limited to the disclosed embodiments. The invention is defined by the claims appended hereto.

References to "one embodiment," "an embodiment," "this embodiment," "an example embodiment," etc., indicate that the embodiment described may include a particular feature, structure, or characteristic, but every embodiment might not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to effect such a feature, structure, or characteristic in connection with other embodiments whether or not explicitly described.

In some instances, one or more components may be referred to herein as "configured to," "configurable to," "operable/operative to," "adapted/adaptable," "able to," "conformable/conformed to," etc. Those skilled in the art will recognize that such terms (e.g. "configured to") can generally encompass active-state components and/or inactive-state components and/or standby-state components, unless context requires otherwise.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In an embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

By way of overview, illustrative embodiments provide nuclear fission reactors, and apparatuses and methods for their operation and simulation. Illustrative embodiments and aspects include, without limitation, nuclear fission reactors and reactor modules, including modular nuclear fission reactors and reactor modules, nuclear fission deflagration wave reactors and reactor modules, modular nuclear fission deflagration wave reactors and modules, methods of operating nuclear reactors and modules including the aforementioned, methods of simulating operating nuclear reactors and modules including the aforementioned, and the like.

Still by way of overview and referring to FIG. 1A, an illustrative nuclear fission reactor 10 will be discussed by way of illustration and not limitation. Nuclear fission reactor 10 may be, but is not limited to, a fission deflagration wave reactor. A reactor 10 suitably includes a nuclear reactor core 100 disposed within a reactor vessel 12 and a reactor coolant system having one or more reactor coolant loops 14.

A reactor may be a modular design including one or more nuclear reactor modules—see, e.g., an exemplary modular reactor 50 illustrated in FIG. 1B. Each reactor module 12 may be operatively coupled in fluid communication to at least one heat sink 58 via a reactor coolant system 56. Thus, each of the nuclear reactor modules may be considered a complete, stand-alone nuclear reactor system by itself. A nuclear reactor module may be neutronically coupled to at least one other adjacent reactor module. Thus, adjacent nuclear reactor modules can be neutronically integrated yet physically separate from each other.

In order to provide an understanding of the control and simulation of reactors such as reactor 10 and reactor 50, illustrative core nucleonics, given by way of non-limiting examples, will be set forth first. While many reactor embodiments are contemplated, several of these non-limiting examples are illustrated in U.S. patent application Ser. No. 12/069,907 entitled MODULAR NUCLEAR FISSION REACTOR, naming AHLFELD, CHARLES E., GILLELAND, JOHN ROGERS, HYDE, RODERICK A., ISHIKAWA, MURIEL Y., MCALEES, DAVID G., MYHRVOLD, NATHAN P., WHITMER, CHARLES, and WOOD, LOWELL L. as inventors, filed 12 Feb. 2008, U.S. patent application Ser. No. 11/605,943, entitled AUTOMATED NUCLEAR POWER REACTOR FOR LONG-TERM OPERATION, naming RODERICK A. HYDE, MURIEL Y. ISHIKAWA, NATHAN P. MYHRVOLD, AND LOWELL L. WOOD, JR. as inventors, filed 28 Nov. 2006, U.S. patent application Ser. No. 11/605,848, entitled METHOD AND SYSTEM FOR PROVIDING FUEL IN A NUCLEAR REACTOR, naming RODERICK A. HYDE, MURIEL Y. ISHIKAWA, NATHAN P. MYHRVOLD, AND LOWELL L. WOOD, JR. as inventors, filed 28 Nov. 2006, and U.S. patent application Ser. No. 11/605,933, entitled CONTROLLABLE LONG TERM OPERATION OF A NUCLEAR REACTOR, naming RODERICK A. HYDE, MURIEL Y. ISHIKAWA, NATHAN P. MYHRVOLD, AND LOWELL L. WOOD, JR. as inventors, filed 28 Nov. 2006, the entire contents of which are hereby incorporated by reference in their entireties. Then, details will be set forth regarding several illustrative embodiments and aspects of reactors.

Considerations

Before discussing details of the reactors such as reactor 10 and reactor 50, some considerations behind reactor embodiments will be given by way of overview but are not to be interpreted as limitations. Some reactor embodiments address many of the considerations discussed below. On the other hand, some other reactor embodiments may address one or a select few of these considerations, and need not accommodate all of the considerations discussed below.

Certain of the nuclear fission fuels envisioned for use in reactor embodiments are typically widely available, such as without limitation uranium (natural, depleted, or enriched), thorium, plutonium, or even previously-burned nuclear fission fuel assemblies. Other, less widely available nuclear fission fuels, such as without limitation other actinide elements or isotopes thereof may be used in embodiments of the reactor. While some reactor embodiments contemplate long-term operation at full power, or some portion thereof, on the order of around $\frac{1}{3}$ century to around $\frac{1}{2}$ century or longer, an aspect of some reactor embodiments does not contemplate nuclear refueling. Other reactor embodiments contemplate nuclear refueling, however. In some cases, embodiments may contemplate burial in-place at end-of-life. Nuclear refueling may occur during shutdown periods and/or operation at power. It is also contemplated that nuclear fission fuel reprocessing may be avoided in some cases, thereby mitigating possibilities for diversion to military uses and other issues.

Some reactor embodiments may be sited underground, thereby addressing large, abrupt releases and small, steady-state releases of radioactivity into the biosphere. Some embodiments may entail minimizing operator controls, thereby automating those embodiments as much as practicable. In some embodiments, a life-cycle-oriented design is contemplated, wherein those embodiments can operate from startup to shutdown at end-of-life. In some life-cycle oriented designs, the embodiments may operate in a substantially fully-automatic manner. Some embodiments lend themselves to modularized construction. Finally, some embodiments may be designed according to high power density or to selected power densities corresponding to a variety of design considerations, such as burn-up criteria, power demand, neutronic flux considerations, and other parameters.

During operation, the materials (e.g., elements and isotopes of elements) in a reactor, especially a reactor core region, change over time. For example, fuel atoms fission into fission products. Atoms of fuel, structural materials, poisons (fission product poisons or poisons intentionally inserted into the reactor), and so forth may absorb neutrons and become other isotopes or elements. These changes may be accounted for by design and reactor control in both the short term and the long term. An ability to move materials throughout the core may increase a reactor's effective lifetime.

Some features of various reactor embodiments result from some of the above considerations. For example, simultaneously accommodating desires to achieve ⅓-½ century (or longer) of operations at full power without shutdown for nuclear refueling and to avoid nuclear fission fuel reprocessing may entail use of a fast neutron spectrum. As another example, in some embodiments a negative temperature coefficient of reactivity ($\alpha T$) is engineered-in to the reactor, such as via negative feedback on local reactivity implemented with strong absorbers of neutrons or other approaches to reactivity control. In the alternative or in addition, some embodiments are configured to control the fission process in whole or in part by achieving a spectral shift in a neutron flux using spectral control methods such as displacing and/or inserting a neutron moderator for some time period. As a further example, in some modular deflagration wave embodiments, a distributed thermostat enables a propagating nuclear fission deflagration wave mode of nuclear fission fuel burn. This mode simultaneously permits a high average burn-up of non-enriched actinide fuels, such as natural uranium or thorium, and use of a comparatively small "nuclear fission igniter" region of moderate isotopic enrichment of nuclear fissionable materials in the core's fuel charge. As another example, in some embodiments, multiple redundancy is provided in primary and secondary core cooling.

Exemplary Embodiments of Nuclear Fission Reactors

Now that some of the considerations behind some of the reactor embodiments have been set forth, further details regarding an exemplary embodiment of nuclear fission reactors will be explained. It is emphasized that the following description of exemplary nuclear reactor embodiments is given by way of non-limiting examples only and not by way of limitation. As mentioned above, several embodiments of reactors are contemplated, as well as further aspects of reactor 10. After details regarding an exemplary embodiment of reactor 10 are discussed, other embodiments and aspects will also be discussed.

Still referring to FIG. 1A, an exemplary embodiment of reactor 10 includes a reactor core assembly 100 that is disposed within a reactor pressure vessel 12. Several embodiments and aspects of reactor core assembly 100 are contemplated that will be discussed later. Some of the features that will be discussed later in detail include nuclear fission fuel materials and their respective nucleonics, fuel assemblies, fuel geometries, and the operation and simulation of reactor core assembly 100 in a complete reactor system.

The reactor pressure vessel 12 suitably is any acceptable pressure vessel known in the art and may be made from any materials acceptable for use in reactor pressure vessels, such as without limitation stainless steel. Within the reactor pressure vessel 12, a neutron reflector (not shown) and a radiation shield (not shown) surround reactor core assembly 100. In some embodiments, the reactor pressure vessel 12 is sited underground. In such cases, the reactor pressure vessel 12 can also function as a burial cask for reactor core assembly 100. In these embodiments, the reactor pressure vessel 12 suitably is surrounded by a region (not shown) of isolation material, such as dry sand, for long-term environmental isolation. The region (not shown) of isolation material may have a size of around 100 meters in diameter or so. However, in other embodiments, the reactor pressure vessel 12 is sited on or toward the Earth's surface.

Reactor coolant loops 14 transfer heat from nuclear fission in reactor core assembly 100 to application heat exchangers 16. The reactor coolant may be selected as desired for a particular application. In some embodiments, the reactor coolant suitably is helium (He) gas. In other embodiments, the reactor coolant suitably may be other pressurized inert gases, such as neon, argon, krypton, xenon, or other fluids such as water or gaseous or superfluidic carbon dioxide, or liquid metals, such as sodium or lead, or metal alloys, such as Pb—Bi, or organic coolants, such as polyphenyls, or fluorocarbons. The reactor coolant loops suitably may be made from tantalum (Ta), tungsten (W), aluminum (Al), steel or other ferrous or non-iron groups alloys or titanium or zirconium-based alloys, or from other metals and alloys, or from other structural materials or composites, as desired.

In some embodiments, the application heat exchangers 16 may be steam generators that generate steam that is provided as a prime mover for rotating machinery, such as electrical turbine-generators 18 within an electrical generating station 20. In such a case, reactor core assembly 100 suitably operates at a high operating pressure and temperature, such as above 1,000K or so and the steam generated in the steam generator may be superheated steam. In other embodiments, the application heat exchanger 16 may be any steam generator that generates steam at lower pressures and temperatures (that is, need not be superheated steam) and reactor core assembly 100 operates at temperatures less than around 550K. In these cases, the application heat exchangers 16 may provide process heat for applications such as desalination plants for seawater or for processing biomass by distillation into ethanol, or the like.

Optional reactor coolant pumps 22 circulate reactor coolant through reactor core assembly 100 and the application heat exchangers 16. Note that although the illustrative embodiment shows pumps and gravitationally driven circulation, other approaches may not utilize pumps, or circulatory structures or be otherwise similarly geometrically limited. The reactor coolant pumps 22 suitably may be provided when reactor core assembly 100 is sited approximately vertically coplanar with the application heat exchangers 16, such that thermal driving head is not generated. The reactor coolant pumps 22 may also be provided when reactor core assembly 100 is sited underground. However, when reactor core assembly 100 is sited underground or in any fashion so reactor core assembly 100 is vertically spaced below the application heat exchangers 16, thermal driving head may be developed between the reactor coolant exiting the reactor pressure vessel 12 and the reactor coolant exiting the application heat exchangers 16 at a lower temperature than the reactor coolant exiting the reactor pressure vessel 12. When sufficient thermal driving head exists, reactor coolant pumps 22 need not be provided to provide sufficient circulation of reactor coolant through reactor core assembly 100 to remove heat from fission during operation at power.

In some embodiments more than one reactor coolant loop 14 may be provided, thereby providing redundancy in the event of a casualty, such as a loss of coolant accident, a loss of flow accident, a primary-to-secondary leak or the like, to any one of the other reactor coolant loops 14. Each reactor coolant loop 14 may be rated for full-power operation, though some applications may remove this constraint.

In some embodiments, closures 24, such as reactor coolant shutoff valves, are provided in lines of the reactor coolant system 14. In each reactor coolant loop 14, a closure 24 may be provided in an outlet line from the reactor pressure vessel 12 and in a return line to the reactor pressure vessel 12 from an outlet of the application heat exchanger 16. Closures 24 may be fast-acting closures that shut quickly under emergency conditions, such as detection of significant fission-product entrainment in reactor coolant. Closures 24 may be provided in addition to a redundant system of automatically-actuated valves (not shown).

One or more heat-dump heat exchangers 26 are provided for removal of after-life heat (decay heat). Heat-dump heat exchanger 26 includes a primary loop that is configured to circulate decay heat removal coolant through reactor core assembly 100. Heat-dump heat exchanger 26 includes a secondary loop that is coupled to an engineered heat-dump heat pipe network (not shown). In some situations, for example, for redundancy purposes, more than one heat-dump heat exchanger 26 may be provided. Heat-dump heat exchanger 26 may be sited at a vertical distance above reactor core assembly 100 so sufficient thermal driving head is provided to enable natural flow of decay heat removal coolant without need for decay heat removal coolant pumps. However, in some embodiments decay heat removal pumps (not shown) may be provided. Reactor coolant pumps may be used for decay heat removal, where appropriate.

Now that an overview of an exemplary embodiment of the reactor 10 has been given, other embodiments and aspects will be discussed. First, embodiments and aspects of reactor core assembly 100 will be discussed. An overview of reactor core assembly 100 and its nucleonics will be set forth first, followed by descriptions of exemplary embodiments and other aspects of reactor core assembly 100.

Given by way of overview and in general terms, structural components of reactor core assembly 100 may be made of tantalum (Ta), tungsten (W), rhenium (Re), various alloys including but not limited to steels such as martensitic stainless steels (e.g., HT9), austenitic stainless steels (e.g., Type 316), or carbon composite, ceramics, or the like. These materials are suitable because of the high temperatures at which reactor core assembly 100 operates, and because of their creep resistance over the envisioned lifetime of full power operation, mechanical workability, and corrosion resistance. Structural components can be made from single materials, or from combinations of materials (e.g., coatings, alloys, multilayers, composites, and the like). In some embodiments, reactor core assembly 100 operates at sufficiently lower temperatures so that other materials, such as aluminum (Al), steel, titanium (Ti) or the like can be used, alone or in combinations, for structural components.

In deflagration wave embodiments, reactor core assembly 100 may include a small nuclear fission igniter and a larger nuclear fission deflagration burn-wave-propagating region. The nuclear fission deflagration burn-wave-propagating region suitably contains thorium or uranium fuel, and functions on the general principle of fast neutron spectrum fission breeding. In some deflagration wave embodiments, uniform temperature throughout reactor core assembly 100 is maintained by thermostating modules which regulate local neutron flux and thereby control local power production. Some example deflagration wave embodiments are further discussed in the aforementioned U.S. patent application Ser. No. 11/605,933, entitled CONTROLLABLE LONG TERM OPERATION OF A NUCLEAR REACTOR ("the '933 application"), which is herein incorporated by reference in its entirety.

Nuclear reactors may be modular. Referring now to FIG. 1B, an illustrative modular reactor 50 is shown. It is emphasized that the following description of an exemplary embodiment of reactor 50 is given by way of non-limiting example only and not by way of limitation. As mentioned above, several embodiments of reactors such as reactors 10 and 50, are contemplated, as well as further aspects of reactors. Features illustrated in reactors 10 and 50 may be implemented separately or in any suitable combination. After details regarding an exemplary embodiment of reactor 50 are discussed, other embodiments and aspects will also be discussed.

Modular reactor 50 is shown by way of illustration and does not limit modular reactors to a toroidal arrangement or any other arrangement of reactor modules 52. It will be understood that no limitation to such a geometric arrangement or to any geometric arrangement of any type whatsoever is intended. To that end, additional arrangements of reactor modules 52 will be discussed further below. In the interest of brevity, the description of additional arrangements of reactor modules 52 is limited to those illustrated herein. However, it will be appreciated that reactor modules 52 may be arranged in any manner whatsoever as desired and may accommodates neutronic coupling of adjacent nuclear fission deflagration wave reactor modules 52.

As discussed above, the exemplary modular reactor 50 suitably includes reactor modules 52. Each reactor module 52 may suitably include a reactor core 54 and a reactor coolant system 56. Each nuclear fission deflagration wave reactor module 52 may be operatively coupled in fluid communication to at least one heat sink 58 via one or more associated reactor coolant systems 56. That is, each reactor modules 52 suitably may be considered a complete, stand-alone nuclear reactor by itself. A reactor module 52 may be neutronically coupled to at least one adjacent reactor module 52. While many embodiments of the modular reactor 50 are contemplated, a common feature among many contemplated embodiments of modular reactor 50 is neutronic coupling of adjacent reactor modules 52 via origination of a nuclear fission deflagration wave, or "burnfront" as further discussed in the aforementioned U.S. patent application Ser. No. 12/069,907 entitled MODULAR NUCLEAR FISSION REACTOR (the '907 application"), which is herein incorporated by reference in its entirety.

Referring now to FIG. 1C, heat energy can be extracted from a nuclear fission reactor core according to another embodiment. In a nuclear fission reactor 110, nuclear fission occurs in a heat generating region 120 (e.g., throughout the fuel-bearing core or propagated in a burning wavefront, for example). Heat absorbing material 160, such as a condensed phase density fluid (e.g., water, liquid metals, terphenyls, polyphenyls, fluorocarbons, FLIBE ($2LiF$—$BeF_2$) and the like) flows through the region 120 as indicated by an arrow 150, and heat is transferred from the heat generating region 120 to heat absorbing material 160. In some embodiments, e.g., fast fission spectrum nuclear reactors, heat absorbing material 160 is chosen to be a nuclear inert material (such as He4) so as to minimally perturb the neutron spectrum. In other embodiments of nuclear fission reactor 110, the neutron content is sufficiently robust, so that a non-nuclear-inert heat absorbing material 160 may be acceptably utilized. Heat absorbing material 160 flows (e.g., by natural convection or by forced movement) to a heat extraction region 130 that is substantially out of thermal contact with heat generating region 120. Heat energy 140 is extracted from heat absorbing material 160 at heat extraction region 130. Heat absorbing material 110 can reside in either a liquid state, a multiphase state, or a substantially gaseous state upon extraction of the heat energy 140 in the heat extraction region 130.

Exemplary Movements of Nuclear Reactor Materials

Figure 2B:
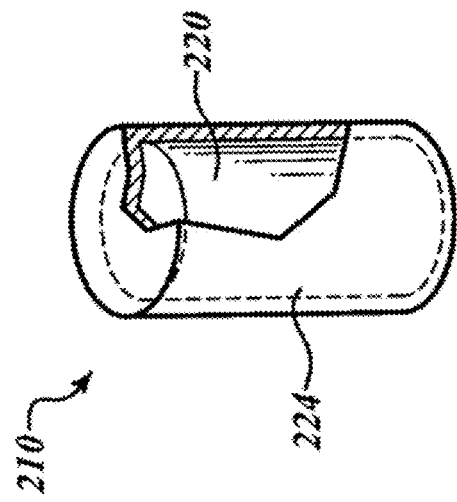
FIGS. 2A and 2B schematically illustrate exemplary nuclear fission fuel assemblies.
Figure 2A:
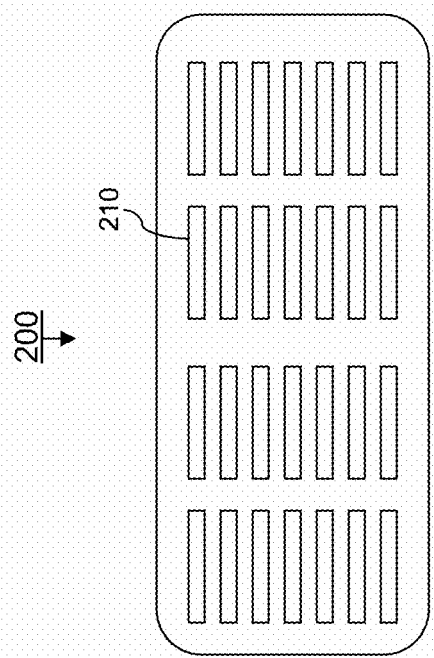

Fuel materials include not only fuel materials, but also structural materials (e.g., cladding). Referring now to FIG. 2A, a reactor 200, which may include any type of fission reactor including those described elsewhere herein, may include nuclear fission fuel assemblies 210 disposed therein. The following discussion includes details of exemplary nuclear fission fuel assemblies 210 that may be used in reactor 200. Referring now to FIG. 2B and given by way of non-limiting example, in an embodiment the nuclear fission fuel assembly 210 suitably includes a nuclear fission fuel assembly 220. In an embodiment, nuclear fission fuel assembly 220 has been "previously burnt." The term "previously burnt" means that at least some components of the nuclear fission fuel assembly have undergone neutron-mediated nuclear fission and that the isotopic composition of the nuclear fission fuel has been modified. That is, the nuclear fission fuel assembly has been put in a neutron spectrum or flux (either fast or slow), at least some components have undergone neutron-mediated nuclear fission and, as result, the isotopic composition of the nuclear fission fuel has been changed. Thus, a previously burnt nuclear fission fuel assembly 220 may have been previously burnt in any reactor including reactor 200, such as without limitation a light water reactor. Previously burnt fission fuel (e.g., in a previously burnt nuclear fission fuel assembly 220) may be chemically untreated subsequent to its previous burning.

It is intended that nuclear fission fuel assembly 220 can include without limitation any type of nuclear fissionable material whatsoever appropriate for undergoing fission in a nuclear fission reactor, such as actinide or transuranic elements like natural thorium, natural uranium, enriched uranium, or the like. Nuclear fission fuel assembly 220 is clad with cladding 224. If nuclear fission fuel assembly has been previously burnt, the cladding 224 may be the "original" cladding in which the nuclear fission fuel assembly 220 was clad before it was burnt. In some other embodiments, a previously burnt nuclear fission fuel assembly 220 may not be clad with "original" cladding 224. For example, a previously burnt nuclear fission fuel assembly 220 may be retained in its original cladding 224, and a new cladding (not shown) may be disposed around an exterior of cladding 224. In some embodiments, the new cladding is made up of cladding sections (not shown) that are configured to help accommodate swelling into the void spaces. In other embodiments, the new cladding may be provided as a barrier, such as a tube, provided between an exterior of the cladding 224 and reactor coolant (not shown).

Figure 3:
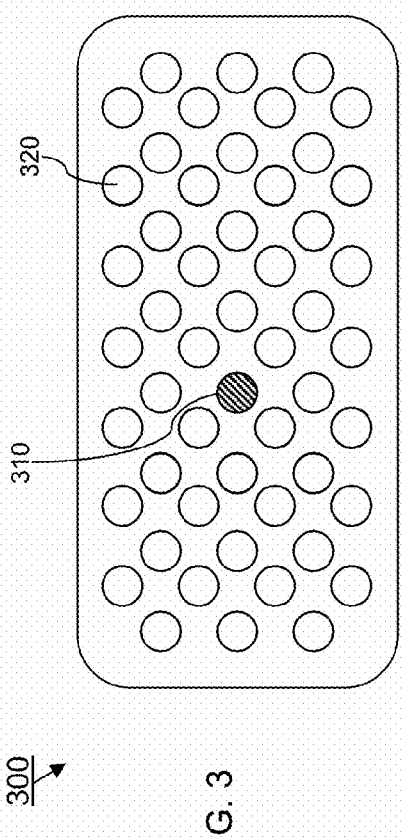
FIG. 3 schematically illustrates exemplary non-contiguous nuclear fission fuel material.

Referring now to FIG. 3, an exemplary nuclear fission fuel structure 300 includes non-contiguous segments 320 of nuclear fission fuel material. Non-contiguous segments 320 may be in "neutronic" contact without being in physical contact. Nuclear fission fuel structure 300 may also include an optional nuclear fission igniter 310. As described in the aforementioned '933 application, nuclear fission igniter 310 may be used in deflagration propagating wave-type nuclear reactors.

Figure 4:
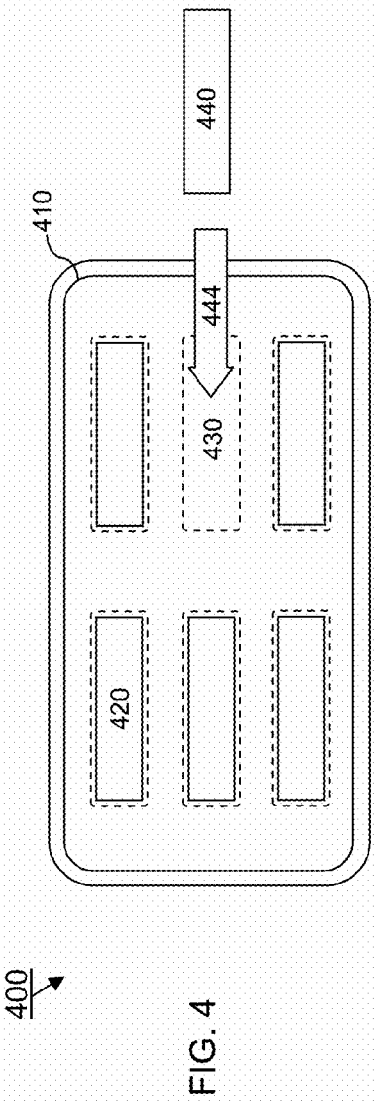
FIG. 4 schematically illustrates an exemplary modular nuclear fission fuel core.

Referring now to FIG. 4, a modular nuclear fission fuel core 400 may include an optional neutron reflector/radiation shield 410 and modular assemblies 420. Modular assemblies 420 may be modular fuel assemblies having some fuel material content. Modular assemblies may also be modular poison assemblies (having some poison material content), modular structural assemblies (serving a primarily structural purpose), modular payload assemblies (designed to carry a payload of, for example, a material to be subjected to a neutron flux), modular blank assemblies (serving as a mere placeholder, for example, to reduce the nucleonic, flow, structural, and thermal perturbations induced by a void or void filled with coolant and/or moderator), or any combination of the above.

Modular assemblies 420 are placed as desired within the assembly receptacles 430. Modular nuclear fission fuel core 400 may be operated in any number of ways. For example, all of the assembly receptacles 430 in the modular nuclear fission fuel core 400 may be fully populated with modular fuel assemblies 420 prior to initial operation. For example, in deflagration propagating wave-type nuclear reactor embodiments, prior to initial operation means prior to origination and propagation of a nuclear fission deflagration propagating wave burnfront within and through the modular fuel assemblies 420. In other reactor embodiments, prior to initial operation means prior to initial criticality or prior to a modular nuclear fission fuel core being exposed to a neutron flux.

As another example, modular assemblies 420 may be removed from their respective assembly receptacles 430 and replaced with other modular assemblies 440 (of the same or different type), as desired; this emplacement is indicated by the arrow 444. For example, "burnt" fuel assemblies may be replaced with "unburnt" fuel assemblies, poison assemblies may be replaced with fuel assemblies, and so forth. The other modular nuclear assemblies 440 may be unused or may have previously been used. For example, in deflagration propagating wave-type nuclear reactor embodiments, modular fission fuel assemblies 420 may be removed and replaced with other modular nuclear fission fuel assemblies 440 after a nuclear fission deflagration wave burnfront has completely propagated through modular nuclear fission fuel assemblies 420. In other embodiments, modular assemblies 420 may be removed and replaced with other modular assemblies 440 for any reason (e.g., testing or experimental uses, redistribution of fuel or poisons, etc.). Such replacement strategies may be used to extend operation of modular nuclear fission fuel core 400 as desired.

As another example, the modular nuclear fission fuel core 400 need not be fully populated with modular assemblies 420 prior to initial operation. For example, less than all of the assembly receptacles 430 can be populated with modular assemblies 420. In such a case, the number of modular fuel assemblies that are placed within the modular nuclear fission fuel core 400 can be determined based upon many reasons, such as a number of modular fuel assemblies that are available, power demand (e.g., electrical loading in watts), that will be ultimately be placed upon the modular nuclear fission fuel core 400, etc. Thus, continued or extended operation of the modular nuclear fission fuel core 400 can be enabled without initially fueling the entire modular nuclear fission fuel core 400 with modular fuel assemblies.

It will be appreciated that the concept of modularity can be extended. For example, in other embodiments, a modular nuclear fission reactor can be populated with any number of nuclear fission reactor cores in the same manner that the modular nuclear fission fuel core 400 can be populated with any number of modular assemblies 420. To that end, the modular nuclear fission reactor can be analogized to the modular nuclear fission fuel core 400 and nuclear fission reactor cores can be analogized to the modular nuclear fission fuel assemblies 420. The several contemplated modes of operation discussed above for the modular nuclear fission fuel core 400 thus apply by analogy to a modular nuclear fission reactor.

Core materials not in a modular assembly may also be moved in a reactor core. It is well known in the art to control reactivity (and thus core average temperature in an operating reactor having a negative coefficient of reactivity) using control rods or other devices. In addition, other neutron modifying structures are contemplated in embodiment of the invention. For example, referring now to FIGS. 5A and 5B, neutron modifying structures 530 can position neutron modifying (e.g., absorbing, reflecting, moderating, etc.) substances in a reactor 500, including a propagating burnfront nuclear fission reactor 550, for a variety of purposes. In an embodiment, neutron modifying structures 530 insert neutron absorbers, such as without limitation Li-6, B-10, or Gd, into nuclear fission fuel. In another embodiment, neutron modifying structures 530 insert neutron moderators, such as without limitation hydrocarbons or Li-7, thereby modifying the neutron energy spectrum, and thereby changing the neutronic reactivity of nuclear fission fuel in the local region.

In some situations in a reactor 500 (including a propagating burnfront nuclear fission reactor 550) an effect of the neutron moderators is associated with detailed changes in the neutron energy spectrum (e.g., hitting or missing cross-section resonances), while in other cases the effects are associated with lowering the mean neutron energy of the neutron environment (e.g., downshifting from "fast" neutron energies to epithermal or thermal neutron energies). In yet other situations, an effect of the neutron moderators is to deflect neutrons to or away from selected locations. In some embodiments, one of the aforementioned effects of neutron moderators is of primary importance, while in other embodiments, multiple effects are of comparable or lesser design significance. In another embodiment, neutron modifying structures 530 contain both neutron absorbers and neutron moderators; in one nonlimiting example, the location of neutron absorbing material relative to that of neutron moderating material is changed to affect control (e.g., by masking or unmasking absorbers, or by spectral-shifting to increase or decrease the absorption of absorbers), in another nonlimiting example, control is affected by changing the amounts of neutron absorbing material and/or neutron moderating material.

In embodiments such as propagating burnfront nuclear fission reactor 550, a nuclear fission deflagration wave burnfront can be driven into areas of nuclear fission fuel as desired, thereby enabling a variable nuclear fission fuel burn-up. In propagating burnfront nuclear fission reactor 550, a nuclear fission deflagration wave burnfront 510 is initiated and propagated. Neutron modifying structures 530 can direct or move the burnfront 510 in directions indicated by arrows 520. In an embodiment, neutron modifying structures 530 insert neutron absorbers behind burnfront 510, thereby driving down or lowering neutronic reactivity of fuel that is presently being burned by burnfront 510 relative to neutronic reactivity of fuel ahead of burnfront 510, thereby speeding up the propagation rate of the nuclear fission deflagration wave. In another embodiment, neutron modifying structures 530 insert neutron absorbers into nuclear fission fuel ahead of burnfront 510, thereby slowing down the propagation of the nuclear fission deflagration wave. In other embodiments, neutron modifying structures 530 insert neutron absorbers into nuclear fission fuel within or to the side of the burnfront 510, thereby changing the effective size of the burnfront 510. In another embodiment, neutron modifying structures 530 insert neutron moderators, thereby modifying the neutron energy spectrum, and thereby changing the neutronic reactivity of nuclear fission fuel that is presently being burned by the burnfront 510 relative to neutronic reactivity of nuclear fission fuel ahead of or behind the burnfront 510.

Thus, local neutronic reactivity in reactor 500, and burnfront 510 in propagating burnfront nuclear fission reactor 550, can be directed as desired according to selected local reaction rate or propagation parameters. For example, local reaction rate parameters can include fission rate, a heat generation density, cross-section dimensions of power density, or the like. In burnfront nuclear fission reactor 550, propagation parameters can include a propagation direction or orientation of the burnfront 510, a propagation rate of the burnfront 510, power demand parameters such the heat generation density, cross-sectional dimensions of a burning region through which the burnfront 510 is to the propagated (such as an axial or lateral dimension of the burning region relative to an axis of propagation of the burnfront 510), or the like. For example, the propagation parameters may be selected so as to control the spatial or temporal location of the burnfront 510, so as to avoid failed or malfunctioning control elements (e.g., neutron modifying structures or thermostats), or the like.

Neutron modifying structures 530 may be actively controlled and/or passively controlled (e.g., programmable). Actively controlled neutron modifying structures are actively controlled by an operator and/or an external control system. Passively controlled neutron modifying structures are responsive to conditions at one or more locations in the core. For example, programmable temperature responsive neutron modifying structures (examples of which are discussed in detail in the aforementioned '933 application) introduce and remove neutron absorbing or neutron moderating material into and from the fuel-charge of a reactor 500 (including embodiments such as propagating burnfront nuclear fission reactor 550). Responsive to an operating temperature profile, programmable temperature responsive neutron modifying structures introduce neutron absorbing or moderating material into the fuel-charge of the nuclear fission reactor to lower operating temperature in the nuclear fission reactor or remove neutron absorbing or moderating material from the fuel-charge of the nuclear fission reactor in order to raise operating temperature of the nuclear fission reactor.

It will be appreciated that temperatures are only one example of control parameters which can be used to determine the control settings of passively controlled or programmable neutron modifying structures. Nonlimiting examples of other control parameters which can be used to determine the control settings of programmable neutron modifying structures include power levels, neutron levels, neutron spectrum, neutron absorption, fuel burnup levels, and the like. In one example, the neutron modifying structures are used to control fuel burnup levels to relatively low (e.g., <50%) levels in order to achieve high-rate "breeding" of nuclear fission fuel for use in other nuclear fission reactors, or to enhance suitability of the burnt nuclear fission fuel for subsequent re-propagation of a nuclear fission deflagration wave in a propagating nuclear fission deflagration wave reactor. Different control parameters can be used at different times, or in different portions of the reactor. It will be appreciated that the various neutron modifying methods discussed previously in the context of neutron modifying structures can also be utilized in programmable temperature responsive neutron modifying structures, including without limitation, the use of neutron absorbers, neutron moderators, combinations of neutron absorbers and/or neutron moderators, variable geometry neutron modifiers, and the like.

Figure 6A:
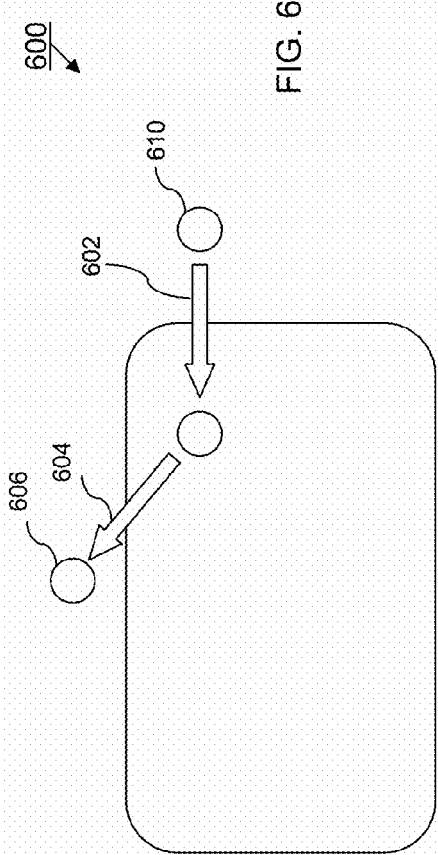
FIGS. 6A and 6B schematically illustrate exemplary nuclear irradiation and movement of material.
Figure 6B:
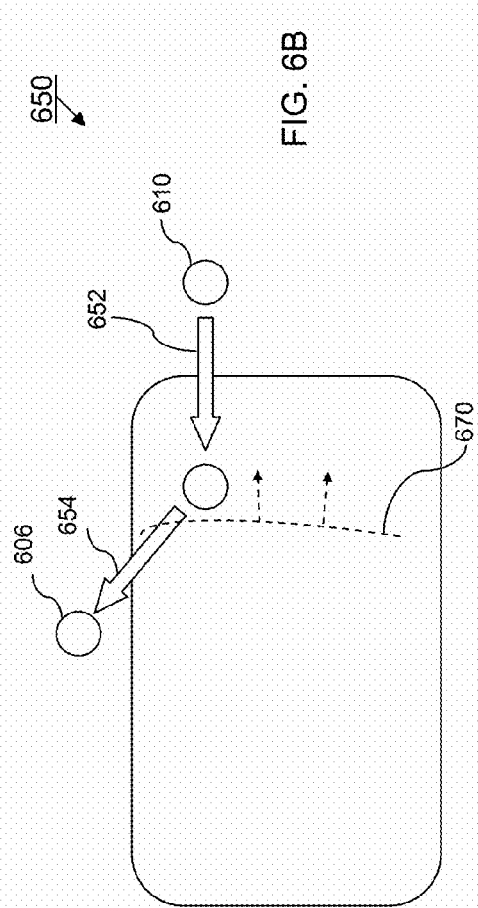

A material may be subjected to a neutron flux in a reactor. It should be appreciated that the neutron irradiation of material in a reactor may be controlled by the duration and/or extent of duration and local power level. In another embodiment, the neutron irradiation of material may be controlled by control of the neutron environment (e.g., the neutron energy spectrum for Np-237 processing) via neutron modifying structures. Referring to FIGS. 6A and 6B, for example, a material 610 inserted into a reactor 600, as indicated generally with arrow 602, will be subject to a neutron flux dependent upon, inter alia, local power level, duration, and neutron modifying structures. In an embodiment where the reactor is a propagating nuclear fission deflagration wave reactor, such as reactor 650, material 610 may be inserted into reactor 650 as indicated generally with arrow 652. In another embodiment, propagating nuclear fission deflagration wave reactor 650 may be operated in a "safe" sub-critical manner, relying upon an external source of neutrons to sustain the propagating burnfront, while using a portion of the fission-generated neutrons for nuclear processing of core materials. It should be appreciated that the movement of material 610 to a location within reactor 600 (or 650) may be from a location external to the reactor (as shown) or from another location within the reactor (not shown).

In some embodiments, a material 610 may be present in a location within the reactor before nuclear fission ignition occurs within a reactor, while in other embodiments the material may be added (i.e., moved to the location) after nuclear fission occurs or occurs in that locale. In some embodiments, material is removed from the reactor, while in other embodiments it remains in place. Alternately, a material having a set of non-irradiated properties is loaded into a reactor. The material is transported (e.g., as indicated generally by arrows 652 and 602) into physical proximity and neutronic coupling with a region of maximized reactivity—in the case of propagating nuclear fission deflagration wave reactor 650, as the nuclear fission deflagration wave propagating burnfront (e.g., burnfront 670) passes through the material.

The material 610 remains in neutronic coupling for a sufficient time interval to convert the material 610 into a second material 606 having a desired set of modified properties. Upon the material 610 having thus been converted into the material 606, the material 606 may be physically transported out of reactor 600 (or reactor 650) as generally indicated by arrow 604 (or 654). The removal can take place either during operation of reactor 600 (or 650) or after shutdown. The removal can be performed as a continuous, sequential, or batch process. In one example, nuclearly processed material 606 may be subsequently used as nuclear fission fuel in another nuclear fission reactor, such as without limitation LWRs or propagating nuclear fission deflagration wave reactors. In another nonlimiting example, nuclearly processed material 606 may be subsequently used within the nuclear fission ignitor of a propagating nuclear fission deflagration wave reactor. In one approach, thermal management may be adjusted to provide thermal control appropriate for any changes in operational parameters, as appropriate for the revised materials or structures.

According to further embodiments, temperature-driven neutron absorption can be used to control a nuclear fission reactor, thereby "engineering-in" an inherently-stable negative temperature coefficient of reactivity ($\alpha T$). Referring now to FIG. 7A, a nuclear reactor 700 is instrumented with temperature detectors 710, such as without limitation thermocouples. In this embodiment, the nuclear fission reactor 700 suitably can be any type of fission reactor whatsoever. To that end, the nuclear fission reactor 700 can be a thermal neutron spectrum nuclear fission reactor or a fast neutron spectrum nuclear fission reactor, as desired for a particular application.

For example, temperature detectors detect local temperature in reactor 700 and generate a signal 714 indicative of a detected local temperature. The signal 714 is transmitted to a control system 720 in any acceptable manner, such as without limitation, fluid coupling, electrical coupling, optical coupling, radiofrequency transmission, acoustic coupling, magnetic coupling, or the like. Responsive to signal 714 indicative of the detected local temperature, control system 720 determines an appropriate correction (positive or negative) to a local neutronic reactivity of reactor 700 (e.g., to return reactor 700 to a desired operating parameter, such as desired local temperatures during reactor operations at power). To that end, control system 720 generates a control signal 724 indicative of a desired correction to local neutronic reactivity. Control signal 724 is transmitted to a dispenser 730 of neutron absorbing material. Control signal 724 suitably may be transmitted in the same manner or a different manner as signal 714. The neutron absorbing material suitably may be any neutron absorbing material as desired for a particular application, such as without limitation Li-6, B-10, or Gd. Dispenser 730 suitably is dispensing mechanism acceptable for a desired application. A reservoir (not shown) may be located locally to dispenser 730 or may be located remotely from the dispensing mechanism 730 (e.g., outside a neutron reflector of reactor 700). Dispenser 730 dispenses the neutron absorbing material within the nuclear fission reactor core responsive to the control signal 1124, thereby altering the local neutronic reactivity.

Referring now to FIG. 7B and given by way of non-limiting example, exemplary thermal control may be established with a neutron absorbing fluid. A thermally coupled fluid containing structure 740 contains a fluid in thermal communication with a local region of reactor 700. The fluid in the structure 740 expands or contracts responsive to local temperature fluctuations. Expansion and/or contraction of the fluid is operatively communicated to a force coupling structure 750, such as without limitation a piston, located external to the nuclear fission reactor 700. A resultant force communicated by the force coupling structure 750 is exerted on neutron absorbing fluid in a neutron absorbing fluid containing structure 760. The neutron absorbing fluid is dispensed accordingly from the structure 760, thereby altering the local neutronic reactivity. In another example, a neutron moderating fluid may be used instead of, or in addition to, the neutron absorbing fluid. The neutron moderating fluid changes the neutron energy spectrum and lowers the mean neutron energy of the local neutron environment, thereby driving down or lowering neutronic reactivity of nuclear fission fuel within the nuclear fission reactor 700. In another example, the neutron absorbing fluid and/or the neutron modifying fluid may have a multiple phase composition (e.g., solid pellets within a liquid).

FIG. 7C illustrates details of an exemplary implementation of the arrangement shown in FIG. 7B. Referring now to FIG. 7C, fuel power density in a nuclear fission reactor 701 is continuously regulated by the collective action of a distributed set of independently-acting thermostating modules, over very large variations in neutron flux, significant variations in neutron spectrum, large changes in fuel composition and order-of-magnitude changes in power demand on the reactor. This action provides a large negative temperature coefficient of reactivity just above the design-temperature of reactor 701. Located throughout the fuel-charge in the nuclear fission reactor 701 in a 3-D lattice (which can form either a uniform or a non-uniform array) whose local spacing may be roughly a mean free path of a median-energy-for-fission neutron (it may be reduced for redundancy purposes), each of these modules includes a pair of compartments, each one of which is fed by a capillary tube. A small thermostat-bulb compartment 761 located in the nuclear fission fuel contains a thermally sensitive material, such as without limitation, Li-7, whose neutron absorption cross-section may be low for neutron energies of interest, while the relatively large compartment 741 is positioned in a different location (e.g., on the wall of a coolant tube) and may contain variable amounts of a neutron absorbing material, such as without limitation, Li-6, which has a comparatively large neutron absorption cross-section. At a pressure of 1 bar, lithium melts at 453K and boils at 1615K, and therefore is a liquid across typical operating temperature ranges of reactor 701. As fuel temperature rises, the thermally sensitive material contained in the thermostat-bulb 761 expands, and a small fraction of it is expelled (e.g., approximately $10^{-3}$, for a 100K temperature change in Li-7), potentially under kilobar pressure, into the capillary tube which terminates on the bottom of a cylinder-and-piston assembly 751 located remotely (e.g., outside of the radiation shield) and physically lower than the neutron absorbing material's intra-core compartment 741 (in the event that gravitational forces are to be utilized). There the modest volume of high-pressure thermally sensitive material drives a swept-volume-multiplying piston in the assembly 751 which pushes a larger (e.g., potentially three order-of-magnitude larger) volume of neutron absorbing material through a core-threading capillary tube into an intra-core compartment proximate to the thermostat-bulb which is driving the flow. There the neutron absorbing material, whose spatial configuration is immaterial as long as its smallest dimension is less than a neutron mean free path, acts to absorptively depress the local neutron flux, thereby reducing the local fuel power density. When the local fuel temperature drops, neutron absorbing material returns to the cylinder-and-piston assembly 751 (e.g., under action of a gravitational pressure-head), thereby returning the thermally sensitive material to the thermostat-bulb 761 whose now-lower thermomechanical pressure permits it to be received.

It will be appreciated that operation of thermostating modules does not rely upon the specific fluids (Li-6 and Li-7) discussed in the above exemplary implementation. In one exemplary embodiment, the thermally sensitive material may be chemically, not just isotopically, different from the neutron absorbing material. In another exemplary embodiment, the thermally sensitive material may be isotopically the same as the neutron absorbing material, with the differential neutron absorbing properties due to a difference in volume of neutronically exposed material, not a difference in material composition.

Reactor Control and Simulation

The aforementioned examples thus demonstrate that fuel, poison, and other materials may be moved throughout a reactor core by several mechanisms with or without moving complete assemblies. Such movements may complicate calculations of nuclide concentrations (i.e., numbers of atoms and isotopes and nuclear isomers of atoms per unit volume) in the core.

In general, the calculation of nuclide concentrations in the core or an operating reactor or simulation thereof may be broken into two interrelated parts: neutron transport and transmutation. Neutron transport calculations may determine neutron populations (e.g., flux and flux spectrum), while transmutation calculations determine the populations of nuclides given a starting population and a neutron flux.

Neutron transport calculations can be done, for example, using deterministic methods (e.g., a discrete ordinates method), using stochastic methods such as a Monte Carlo method, or by using a hybrid of the two (e.g., using deterministic methods to calculate certain aspects in an otherwise Monte Carlo implementation). Deterministic methods typically solve transport equations using average particle behavior. A discrete method typically divides the phase space into many small volumes. Neutrons moving between adjacent volumes take a small amount of time to move a small distance. Thus, calculation approaches the integro-differential transport equation (having space and time derivatives) as time, volume, and distance are made smaller, i.e., approach 0.

Monte Carlo methods, on the other hand, obtain answers by simulating individual particles and recording some aspects of their average behavior. Monte Carlo methods are often used when it is difficult to determine an example result using a deterministic method. As applied to neutron transport, a Monte Carlo method may simulate the individual probabilistic events, thus following neutrons through their lifecycle from birth to death (e.g., absorption, escape, etc.). The associated probability distributions (e.g., represented by continuous and/or discrete probability density functions) are randomly sampled to determine the outcome (e.g., scatter, fission, neutron capture, leakage) at each time step. Collisions may be modeled using physics equations and cross sectional data. The frequency of collisions, and thus neutron induced reactions such as fission and loss due to absorption by poisons are, of course, dependent on the concentration of fissile isotopes and poisons respectively in the volume of interest.

Cross-sectional data for an atom represents the effective cross sectional area that an atom presents to a particle for an interaction, e.g., for a neutron, for interactions such as the various scattering and absorption types. Cross sections typically vary by the atom, the particle, and the energy of the particle. Thus, a cross section may be used to express the likelihood of a particular interaction of an atom with an incident particle having a certain energy.

Microscopic properties, such as a microscopic cross section for a reaction (e.g., scatter, radiative capture, absorption, fission), are intrinsic properties of a type of nuclei (i.e., of a specific material's nuclei). Macroscopic properties, such as a macroscopic cross section for a reaction, is a property of a volume of the material having a concentration or density (e.g., in number of atoms per unit volume) of the material. Microscopic cross section is typically expressed in units of area (e.g., $cm^2$ or "barns"—a barn is $10^{-28}$ $m^2$). Macroscopic cross sections are proportional to the microscopic cross section multiplied by the density, or equivalently 1/(mean free path length) and thus are expressed in units of 1/length (e.g., $m^{-1}$).

Cross sectional data is typically determined by empirical means. Thus, especially for short-lived isotopes, cross sectional data for a large spectrum of neutron energies is simply not available yet. Performing accurate Monte Carlo calculations on volumes having a population of isotopes not having completely known or well-characterized properties such as neutron cross-sections is therefore difficult. Additionally, even if all the cross sectional data for each and every material was well characterized, the computational burden would be significant. Methods which may help reduce these difficulties and/or computational burdens are described in detail elsewhere herein.

Transmutation calculations determine the inventory or concentration of each nuclide as it varies, for example, under a neutron flux. In general, transmutation calculations may be thought of as determining a new population of a material based on the loss rate and the production rate of the material subject to a given neutron flux. A given atom of a material may, for example, fission and produce two fission products; while another atom of the material might be converted to an isotope of a larger atomic mass number (A) after capturing a neutron. Yet another atom of the material might beta or alpha decay to another element, and so forth. Thus, the rate of change of an amount of a material in an operating reactor is typically the sum of the loss rate due to decay, gain rate due to decay, loss due to neutron-induced reactions, and gain due to neutron-induced reactions.

It is to be appreciated that transmutation calculations for materials depend upon the current neutron flux, and neutron flux calculations depend upon the current concentration of materials such as fissile isotopes and poisons. These calculations may be linked together in various ways, including but not limited to such iterative numerical analysis tools such as the Runge-Kutta methods. A complete description of Runge-Kutta is not necessary, as it is well known in the art. In general, however, explicit Runge-Kutta methods, "solve" the initial value problem $$y'=f(t,y), y(t_0)=y_0$$

using the equations $$y_{n+1} = y_n + h\sum_{i=1}^{s} b_i k_i \text{ where}$$

$$k_1=f(t_n,y_n),$$

$$k_2=f(t_n+c_2h, y_n+a_{21}hk_1),$$

$$k_3=f(t_n+c_3h, y_n+a_{31}hk_1+a_{32}hk_2),$$

$$k_s=f(t_n+c_sh, y_n+a_{s1}hk_1+a_{s2}hk_2+\ldots+a_{s,s-1}hk_{s-1})$$

To specify a specific Runge Kutta method, one may supply an integer, s, and a set of coefficients $a_{ij}$, $b_{ij}$, and $c_i$. The Runge Kutta method is consistent if the coefficients are such that:

$$\sum_{j=1}^{i-1} a_{ij} = c_i \text{ for } i = 2, \ldots, s.$$

Thus, for example, a consistent fourth order Runge Kutta is:

$$y_{n+1}=y_n+\tfrac{1}{6}h(k_1+k_2+k_3+k_4),$$

$$t_{n+1}=t_n+h$$

where $$k_1=f(t_n,y_n),$$

$$k_2=f(t_n+\tfrac{1}{2}h, y_n+\tfrac{1}{2}hk_1),$$

$$k_3=f(t_n+\tfrac{1}{2}h, y_n+\tfrac{1}{2}hk_2), \text{ and}$$

$$k_4=f(t_n+h, y_n+hk_3).$$

Thus, the next value, $y_{n+1}$, is determined by the present value, $y_n$, plus the product of the size of the interval and an estimated slope. The slope is a weighted average of slopes: $k_1$ is the slope at the beginning of the interval, $k_2$ is the slope at the midpoint of the interval using slope $k_1$ to determine the value of y at the point $t_n+h/2$ using Euler's method; $k_3$ is again the slope at the midpoint, but now using the slope $k_2$ to determine the y-value; and $k_4$ is the slope at the end of the interval, with its y-value determined using $k_3$. The Euler method is a one stage Runge Kutta method. The Euler method essentially estimates the slope and advances a small step using that slope. Examples of second order Runge Kutta methods include the midpoint method and Heun's method.

Thus, an updated amount (e.g., inventory or concentration) of a material in a reactor core or volume of interest (inside or outside the reactor core) may be determined by determining an average rate of change of the amount of the material based on the previous amount of the material and a neutron flux. This may be performed individually or simultaneously for all of the materials in the reactor core or the volume of interest. The neutron flux, in turn, may be determined by determining an average rate of change of flux based on the amount of the materials in the core.

Accuracy of the calculations may be enhanced if subvolumes of a reactor are considered rather than a reactor core in gross. For example, gross calculations may be performed on a homogenous model of a reactor core—the core is simulated to have an even distribution of all materials. Higher resolution may be obtained by representing the core as a volume comprised of many homogeneous cells, each cell being allowed to have different concentrations of materials. Although cells need not be homogenous, homogenous cells are typically preferred to simplify calculations.

If the resolution is high enough, the core may be represented with very good precision. For example, a three-dimensional geometry of cells, each having a defined geometry and concentrations of materials may be used. Cells may be defined in many ways, including but not limited to by their bounding surfaces such as equations of surfaces and intersections and unions of regions of space. Transport calculations typically determine for each cell the number of reactions and boundary crossings to each neighboring cell.

Figure 8C:
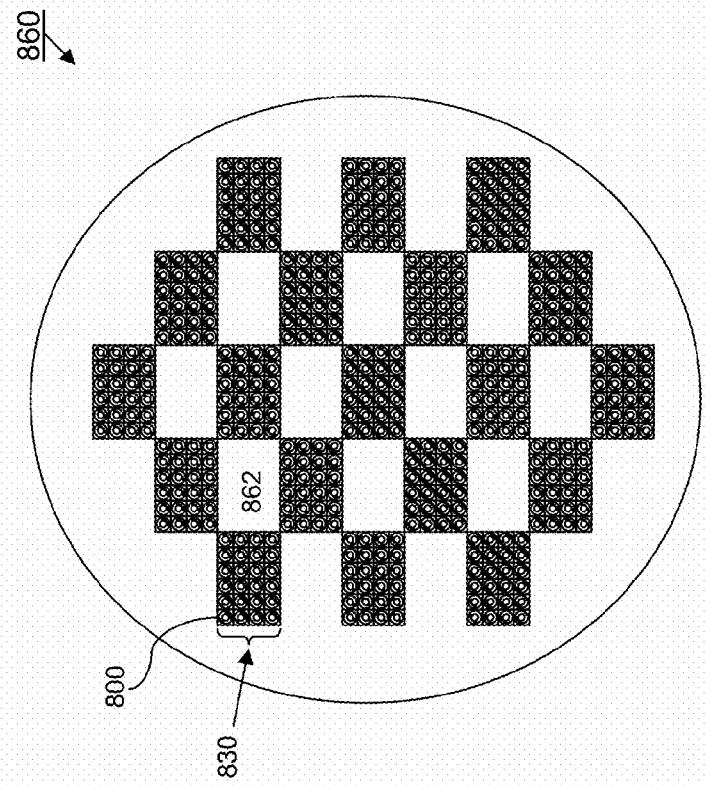
FIGS. 8A through 8C schematically illustrates exemplary cells and groups of cells.
Figure 8A:
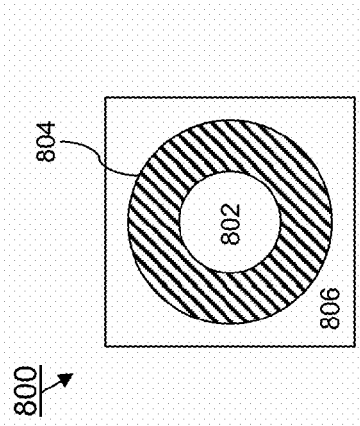

As illustrated in FIG. 8A, a structure 800 may be formed by cells having complicated shapes. For the sake of simplicity, only two dimensions are shown (i.e., a cross section), but it is understood that cells are typically three dimensional. Moreover, in this non-limiting example, the locations and shapes are relatively uniform. For example, exemplary cell 802 may be a sphere. Exemplary cell 804 may be a larger sphere excluding the volume defined by cell 802. Exemplary cell 806 may be a cube, excluding the volume circumscribed by the outer spherical surface of cell 804. Alternatively, cell 802 could be a cylinder extending some distance into the figure, cell 804 could be the volume determined by a larger cylinder excluding the volume of cell 802, and cell 806 could be a rectangular prism excluding the volume within the cylinder defined by cell 804's outer surface. In any case, cell 802 may include one composition of fuel materials, poison materials, and structural materials. Cell 804 may have a second composition of fuel materials, poison materials, and structural materials. Cell 806 may be a third composition of structural materials only (e.g., cladding).

Figure 8B:
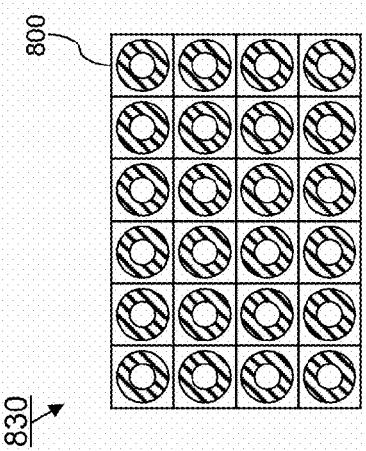

As illustrated in FIG. 8B, cells may be combined to form larger structures. For example, structure 800 may represent a rectangular prism-shaped fuel assembly. Structure 830 includes many structures 800. For example, structure 830 may define a fuel module of six fuel pins by four fuel pins and fifty fuel pins deep. Thus, even larger structures may be formed. For example, as illustrated by FIG. 8C, exemplary structure 860 may represent a reactor core having an arrangement of nineteen structures 830 (e.g., fuel modules) each including many structures 800 (fuel assemblies). Thus, specific physical locations in space of an actual operating reactor or a detailed reactor design may be represented by a cell. Calculations may be performed using a detailed model representing an actual reactor during operation. The results may be used to make decisions regarding reactor control. Similarly, calculations may be performed on a representation of a proposed reactor to test operating procedures or to test proposed fuel and poison loading.

Transmutation and transport calculations may be performed for each cell. For a complex model, this can result in a large computational burden due in part to the large number of cells. The computational burden is also increased by the number of materials which may be present in each cell. Prior to operation, a reactor already contains a large number of materials (e.g., various fuel isotopes, installed poison isotopes, structural isotopes, moderator, reflectors, etc.). Immediately upon operation, however, the number of materials (e.g., isotopes) in the reactor increases significantly due to neutron capture and especially neutron-induced fission.

Figure 9:
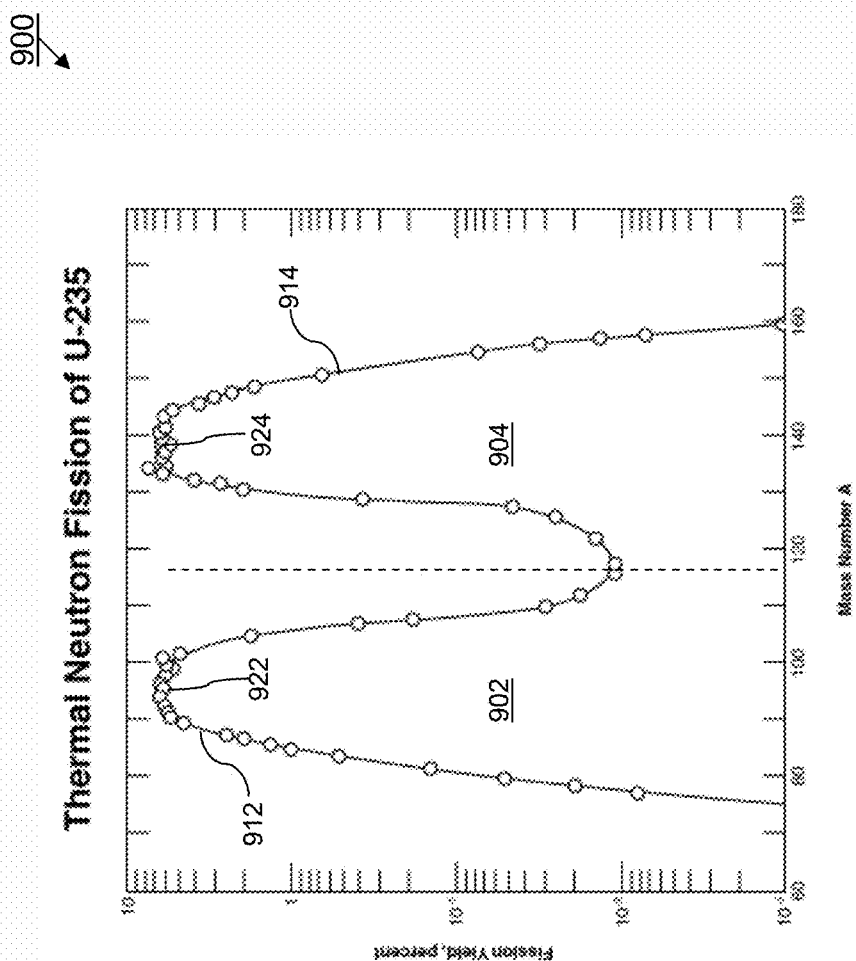
FIG. 9 illustrates an exemplary fission yield curve.

The distribution of fission products from a fission of a given isotope induced by a neutron of a given energy may be described by a fission product yield curve. FIG. 9 illustrates an exemplary fission product yield curve 900. It should be appreciated that the graph illustrates the total fission yield in percent of fission products having each mass number (A). More than one isotope may have a given mass number. Thus, fission products having a mass number of, for example, 140, fall under the point on the curve defined by mass number=140. In this example, the fission products produced by the thermal fission of U-235 is illustrated on fission product yield curve 900. Curves for fissions of U-235 induced by fast neutrons will have a similar but different shape. Neutron energies may be classified in more detail than "fast" or "thermal." Also, fission yield curves for other fissile isotopes will have a similar but different shape. In general, however, fission yield curves follow this "M" shape having two peaked "humps." Thus, the curve may be divided into two portions, left curve portion 912 which includes a left peak 922, and right curve portion 914 which includes a right peak 924. Thus area 902 falls under left peak 922 and left curve portion 912 and area 904 falls under right peak 924 and right curve portion 914. As a reactor operates, the level of fission products tends to increase due to fission (i.e., have a production rate due to fission), but tends to decrease due to decay and neutron capture or "burnout" (i.e., have loss rates due to decay and capture). Transmutation calculations may be used to determine or approximate these levels during reactor operation.

As discussed elsewhere herein, reactor control systems, such as control system 720, may determine appropriate corrections (positive or negative) to a local neutronic reactivity of reactor 700 (e.g., to return reactor 700 to a desired operating parameter, such as desired local temperatures during reactor operations at power). To that end, control systems may generate a control signal (e.g., control signal 724) indicative of a desired correction to local neutronic reactivity. Reactor control systems and control signals are not limited to the embodiments such as control system 720 and control signal 724. Reactor Control Systems may also control other neutron affecting or absorbing features such as control rods, to control and/or shut down the reactor as desired, which is well known in the art. Reactor Control Systems may also generate control signals to order changes in various flows, e.g., the flow of heat absorbing material (e.g., coolant) through the reactor or portions of the reactor by ordering changes in reactor coolant pump (e.g., reactor coolant pumps 22) operation and/or various valve positions in the reactor system, including but not limited to reactor closures (e.g., closures 24) or reactor coolant shutoff valves, steam shutoff valves, etc. Reactor Control Systems may also order changes in breaker positions (e.g., reactor coolant pump power supply breakers, steam turbine-generator output breakers, etc.). As is well known in the art, Reactor Control Systems may have temperature inputs (e.g., control system 720 receiving input from temperature detectors 710) in addition to neutron detectors (e.g., to sense neutron flux to determine reactor power or local reactor power at a portion of the core), and flow and position detectors (e.g., venturi-type flow detectors, valve position indicators, breaker position indicators). Thus, Reactor Control Systems may control the flow of heat absorbing material (e.g., coolant) through the reactor and/or portions of the reactor to control overall temperatures and local temperatures in response to overall reactor thermal power and/or local reactor thermal power. Reactor Control Systems may also provide operator indications and accept operator inputs. Thus, a Reactor Control System monitors reactor operations, may provide some automatic control features (such as changing flow rates and moving control rods or otherwise positioning neutron affecting or absorbing materials, which are described in more detail elsewhere herein), displays operational parameters, and accepts and executes operator inputs for manual control actions.

Example Computer System

Some aspects and/or features of the present invention can be implemented by software, firmware, hardware, or a combination thereof. Calculations may be approximated using table look-ups. Hardware implementations of individual components are not limited to digital implementations and may be analog electrical circuits. Additionally, embodiments may be realized in a centralized fashion in at least one communication system, or in a distributed fashion where different elements may be spread across several interconnected communication systems. Any kind of computer system or other apparatus adapted for carrying out the methods described herein may be suited.

Figure 10:
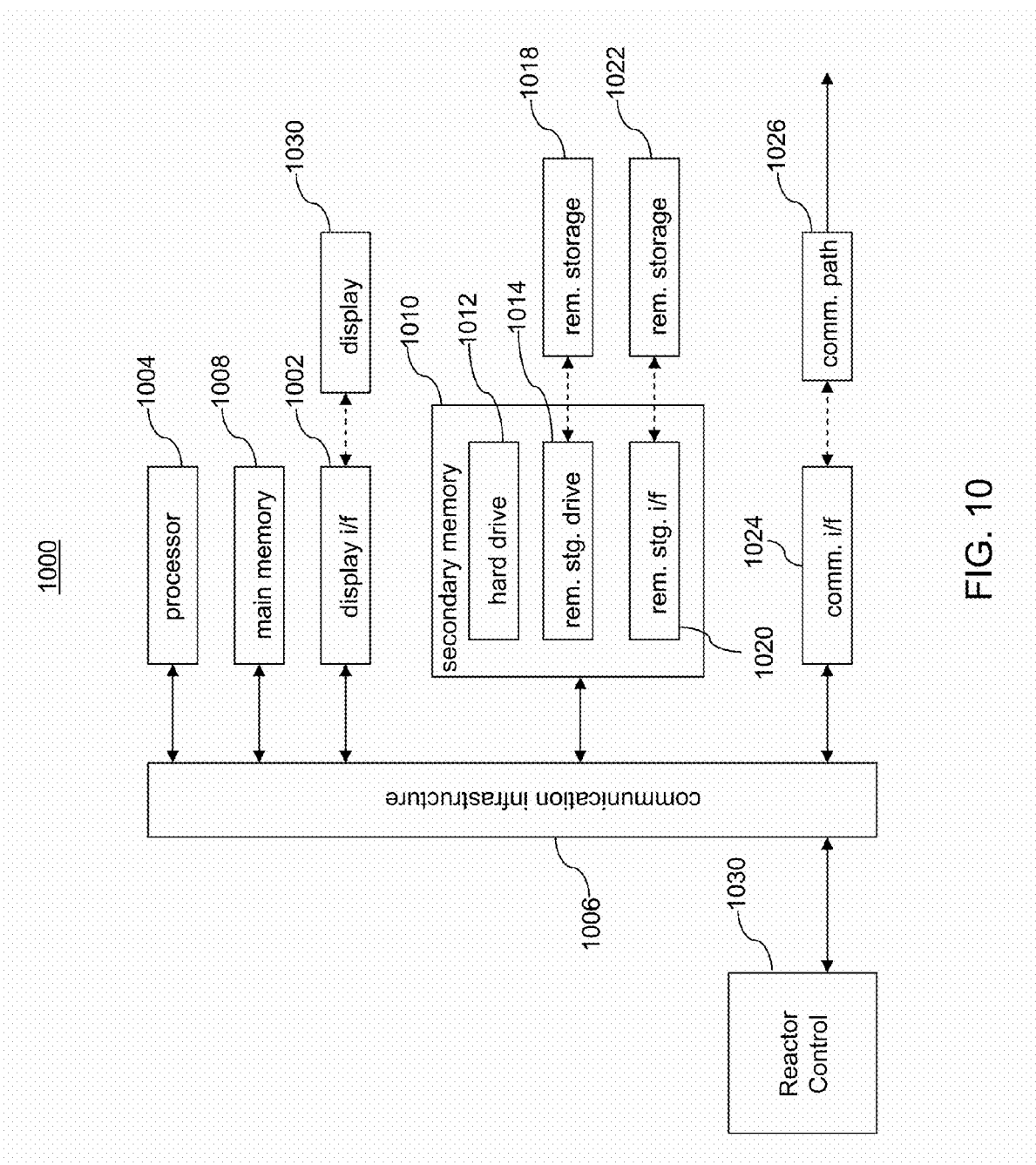
FIG. 10 schematically illustrates an exemplary reactor control system.

FIG. 10 illustrates an example computer system 1000 in which the present invention, or portions thereof, can be implemented as computer-readable code. Various embodiments of the invention are described in terms of this example computer system 1000. After reading this description, it will become apparent to a person skilled in the relevant art how to implement the invention using other computer systems and/or computer architectures.

Computer system 1000 includes one or more processors, such as processor 1004. Processor 1004 can be a special purpose or a general purpose processor. Processor 1004 is connected to a communication infrastructure 1006 (for example, a bus or network).

Computer system 1000 also includes a main memory 1008, preferably random access memory (RAM), and may also include a secondary memory 1010. Secondary memory 1010 may include, for example, a hard disk drive 1012, a removable storage drive 1014, any type of non-volatile memory, and/or a memory stick. Removable storage drive 1014 may comprise a floppy disk drive, a magnetic tape drive, an optical disk drive, a flash memory, or the like. The removable storage drive 1014 reads from and/or writes to a removable storage unit 1018 in a well known manner. Removable storage unit 1018 may comprise a floppy disk, magnetic tape, optical disk, etc. which is read by and written to by removable storage drive 1014. As will be appreciated by persons skilled in the relevant art(s), removable storage unit 1018 includes a computer usable storage medium having stored therein computer software and/or data.

In alternative implementations, secondary memory 1010 may include other similar means for allowing computer programs or other instructions to be loaded into computer system 1000. Such means may include, for example, a removable storage unit 1022 and an interface 1020. Examples of such means may include a program cartridge and cartridge interface (such as that found in video game devices), a removable memory chip (such as an EPROM, or PROM) and associated socket, and other removable storage units 1022 and interfaces 1020 which allow software and data to be transferred from the removable storage unit 1022 to computer system 1000.

Computer system 1000 may also include a communications interface 1024. Communications interface 1024 allows software and data to be transferred between computer system 1000 and external devices. Communications interface 1024 may include a modem, a network interface (such as an Ethernet card), a communications port, a PCMCIA slot and card, or the like. Software and data transferred via communications interface 1024 are in the form of signals which may be electronic, electromagnetic, optical, or other signals capable of being received by communications interface 1024. These signals are provided to communications interface 1024 via a communications path 1026. Communications path 1026 carries signals and may be implemented using wire or cable, fiber optics, a phone line, a cellular phone link, an RF link or other communications channels.

Computer system 1000 may also be coupled to a Reactor Control system 1030. Reactor Control System 1030 may be directly interfaced to the communications infrastructure 1006 as shown in the figure. Reactor Control System may also be interfaced via communications interface 1024 or communications interface 1024 and communications path 1026.

In this document, the terms "computer program medium" and "computer usable medium" are used to generally refer to media such as removable storage unit 1018, removable storage unit 1022, and a hard disk installed in hard disk drive 1012. Signals stored elsewhere and carried over communications path 1026 can also embody the logic described herein. Computer program medium and computer usable medium can also refer to memories, such as main memory 1008 and secondary memory 1010, which can be memory semiconductors (e.g. DRAMs, etc.). These computer program products are means for providing software to computer system 1000.

Computer programs (also called computer control logic) are stored in main memory 1008 and/or secondary memory 1010. Computer programs may also be received via communications interface 1024. Such computer programs, when executed, enable computer system 1000 to implement the present invention as discussed herein. In particular, the computer programs, when executed, enable processor 1004 to be used in the performance of processes of the present invention, such as the methods illustrated by the flowcharts described elsewhere herein. Accordingly, such computer programs represent controllers of the computer system 1000. Where the invention is implemented using software, the software may be stored in a computer program product and loaded into computer system 1000 using removable storage drive 1014, interface 1020, hard drive 1012 or communications interface 1024.

The invention is also directed to computer program products comprising software stored on any computer useable medium. Computer programs or software in the present context means any expression, in any language, code or notation, of a set of instructions intended to cause a system having an information processing capability to perform a particular function either directly or after either or both of the following: a) conversion to another language, code or notation; b) reproduction in a different material form. Such software, when executed in one or more data processing device, causes a data processing device(s) to operate as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

Methods for Mapping Reactor Materials

Now that illustrative embodiments of nuclear reactors and reactor control and simulation have been discussed, illustrative methods associated therewith will now be discussed.

Following are a series of flowcharts depicting implementations of processes. For ease of understanding, the flowcharts are organized such that the initial flowcharts present implementations via an overall "big picture" viewpoint and thereafter the following flowcharts present alternate implementations and/or expansions of the "big picture" flowcharts as either sub-steps or additional steps building on one or more earlier-presented flowcharts. Those having skill in the art will appreciate that the style of presentation utilized herein (e.g., beginning with a presentation of a flowchart(s) presenting an overall view and thereafter providing additions to and/or further details in subsequent flowcharts) generally allows for a rapid and easy understanding of the various process implementations. In addition, those skilled in the art will further appreciate that the style of presentation used herein also lends itself well to modular design paradigms. The blocks may be performed in any order or concurrently unless specified otherwise. Some embodiments of the present invention do not require the performance of each and every block, regardless whether the block or blocks is/are explicitly labeled or described as optional. Other embodiments require the repetition of one or more blocks, regardless whether the block is labeled or described as repeated.

Figure 11:
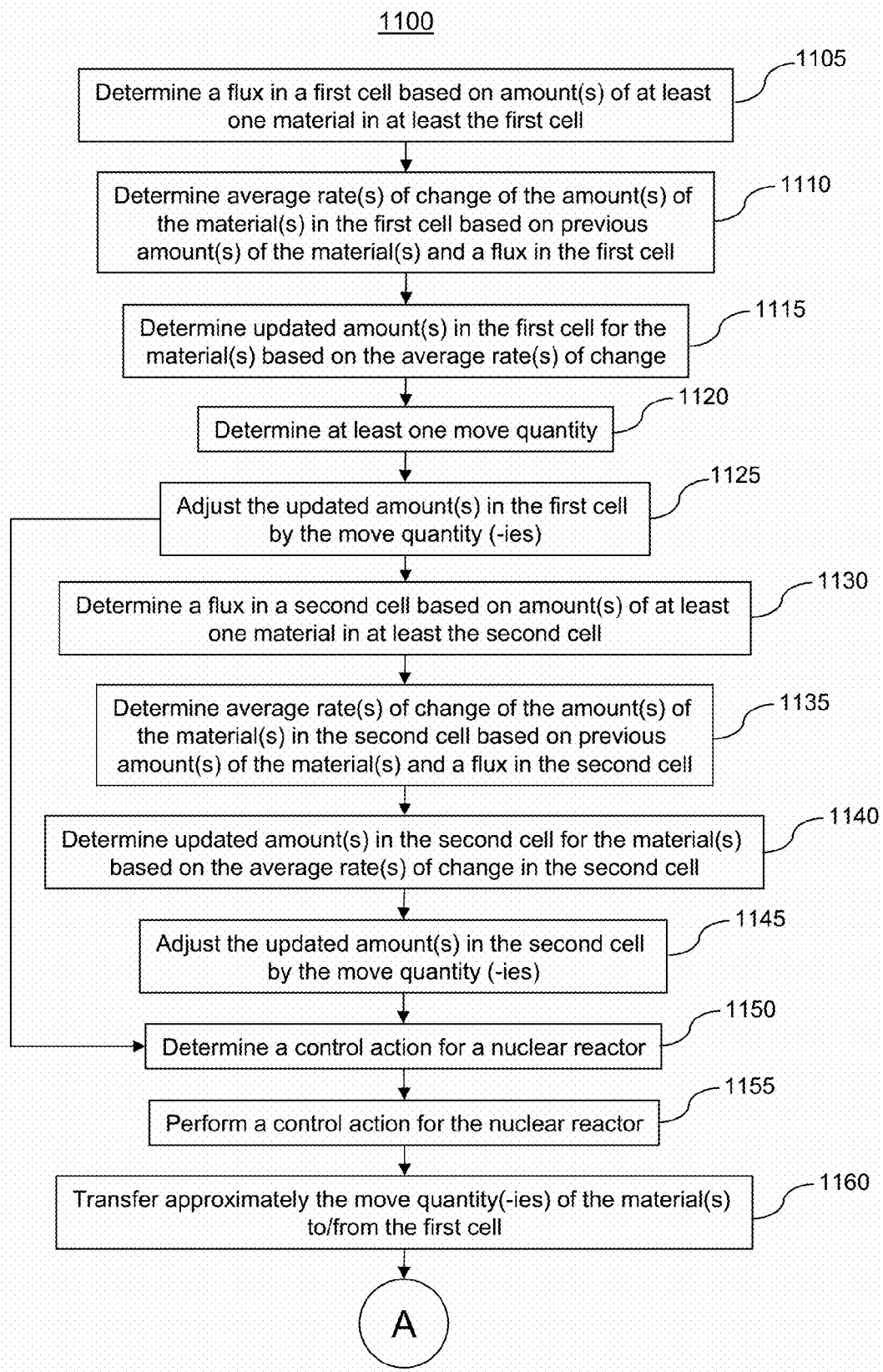

Referring now to FIG. 11, an illustrative method 1100 is provided for simulating and/or controlling a nuclear reactor. The method 1100 starts at a block 1105.

At block 1105, a flux in a first cell is determined based on the amount(s) of at least one material in at least the first cell. The flux determination may be further based on the amounts of more than one material in the first cell and/or a previous flux in the first cell. Also, the flux determination may be further based on the amounts one or more materials in one or more other cells. For example, a flux may be determined by a transport calculation (e.g., solving neutron transport equations). A "flux" may be any flux (e.g., photon, alpha, beta, etc.), but is typically a neutron flux. The flux may be determined by numerical analysis methods using an average rate of change of the flux. The average rate of change of the flux may be a weighted average (e.g., as determined by a Runge Kutta method or any other method). The flux may be dependent upon the amount(s) of one or more materials in the first cell. The flux may be further dependent upon the amount(s) of one or more materials in one or more additional cells. An "amount" may be a mass or a number (e.g., number of atoms) or may be a density/concentration (e.g., mass or number of particles per unit volume). A cell represents a physical location or region in a nuclear reactor. The reactor may be, for example, real or simulated, currently operating, or under design. The reactor may be any type or sub-type of reactor, including light water reactor, heavy water reactor, pressurized water reactor, boiling water reactor, propagating nuclear fission deflagration wave reactor, etc. The reactor is typically represented by many homogeneous cells, but heterogeneous cells may be used. Each cell may have the same or different shape or volume as any other cell. A material may be one or more of any element, molecule, family of elements, family of molecules, isotope, family of isotopes, isomers of isotopes, fertile isotope(s), fission product(s), fission product poisons, etc. Materials are typically elements and isotopes of elements. Thus, U-235 and U-238 are thus typically two different materials.

At block 1110, the average rate(s) of change of the one or more amount(s) of one or more material(s) in the first cell is determined based on previous amount(s) of the material(s) and a flux in the first cell. For example, average rates of change may be determined by a transmutation rate calculation. The average rate of change of the amount of one or more materials may be determined by numerical analysis methods using an average rate of change of the amount. The average rate of change of the flux may be a weighted average (e.g., as determined by a Runge Kutta method or any other method). The amount may be dependent upon the flux in the first cell. The average rates of change for the one or more materials may be solved individually or simultaneously (such as when coupled through transmutation equations).

At block 1115, updated amount(s) in the first cell for the material(s) are determined based on the average rate(s) of change. For example, updated amounts may be determined by performing transmutation calculations. The updated amounts for the one or more materials may be solved individually or simultaneously (such as when coupled through transmutation equations).

At block 1120, at least one move quantity is determined. A move quantity may be any quantity of one or more materials such as a quantity of a material that is desired to be moved into or out of a cell. In this block one or more move quantities may each apply to one or more materials in the first cell. A move quantity may be determined in response to one or more reactor parameters such as a flux or a fluence, a power level (local or overall), a temperature, etc. A reactor parameter may be compared to a threshold or set point for that parameter. This block may be repeated as suitable, e.g., for each of one or more materials in the first cell.

At block 1125, the updated amount(s) in the first cell is (are) adjusted by the move quantity(-ies). One or more move quantities are each applied to the amounts of one or more materials in the first cell, thus increasing or decreasing each affected amount. A move amount of zero may be used to signify no change. In an embodiment, a material may be moved outside the reactor. In this case, blocks 1130 through 1145 may be skipped.

At block 1130, a flux in a second cell is determined based on amount(s) of at least one material in the second cell. As discussed above, the flux determination may be further based on the amounts of more than one material in the second cell. Also, the flux determination may be further based on the amounts one or more materials in one or more other cells.

At block 1135, average rate(s) of change of the amount(s) of the material(s) in the second cell based on previous amount(s) of the material(s) and a flux in the second cell is determined.

At block 1140, updated amount(s) in the second cell for the material(s) is (are) determined based on the average rate(s) of change in the second cell.

At block 1145, the updated amount(s) in the second cell is (are) adjusted by the move quantity(-ies).

At block 1150, a control action for a nuclear reactor is determined. A control action may be a change (positive or negative) to a local neutronic reactivity of a reactor using any neutron affecting or absorbing features such as movement of neutron absorbing materials or fluids, control rods, etc.; a change in one or more various flows, e.g., the flow of heat absorbing material (e.g., coolant) through the reactor by ordering changes in reactor coolant pump operation and/or various valve positions in the reactor system, including but not limited to reactor closures or reactor coolant shutoff valves, steam shutoff valves, etc.; a change in one or more breaker positions (e.g., reactor coolant pump power supply breakers, steam turbine-generator output breakers, etc.); or the like. The determined control action may be displayed to a user. In an embodiment, this block is optional.

At block 1155, a control action for the nuclear reactor is performed. This performance may be automatic or manual. In an embodiment, this block is optional.

At block 1160, approximately the move quantity(-ies) of the material(s) is/are transferred to/from the first cell location in a reactor. In this block, an actual of amount of at least one substance corresponding to one or more of the at least one material is transferred from or to one location (i.e., from the first cell location or to the first cell location). This block may be performed in conjunction with block 1155 or separately. The transferred amount of a substance (i.e., approximately the move quantity of the corresponding material or materials) may, but is not required, to be associated with a component in the location represented by the cell (e.g., an assembly including fuel, poison, structural components, or any combination of these). In an embodiment such as a simulation or evaluation of a reactor design, this step is optional.

The method stops at block 1160, but may continue to point A as indicated in other methods in other figures.

Figures 12, 13:
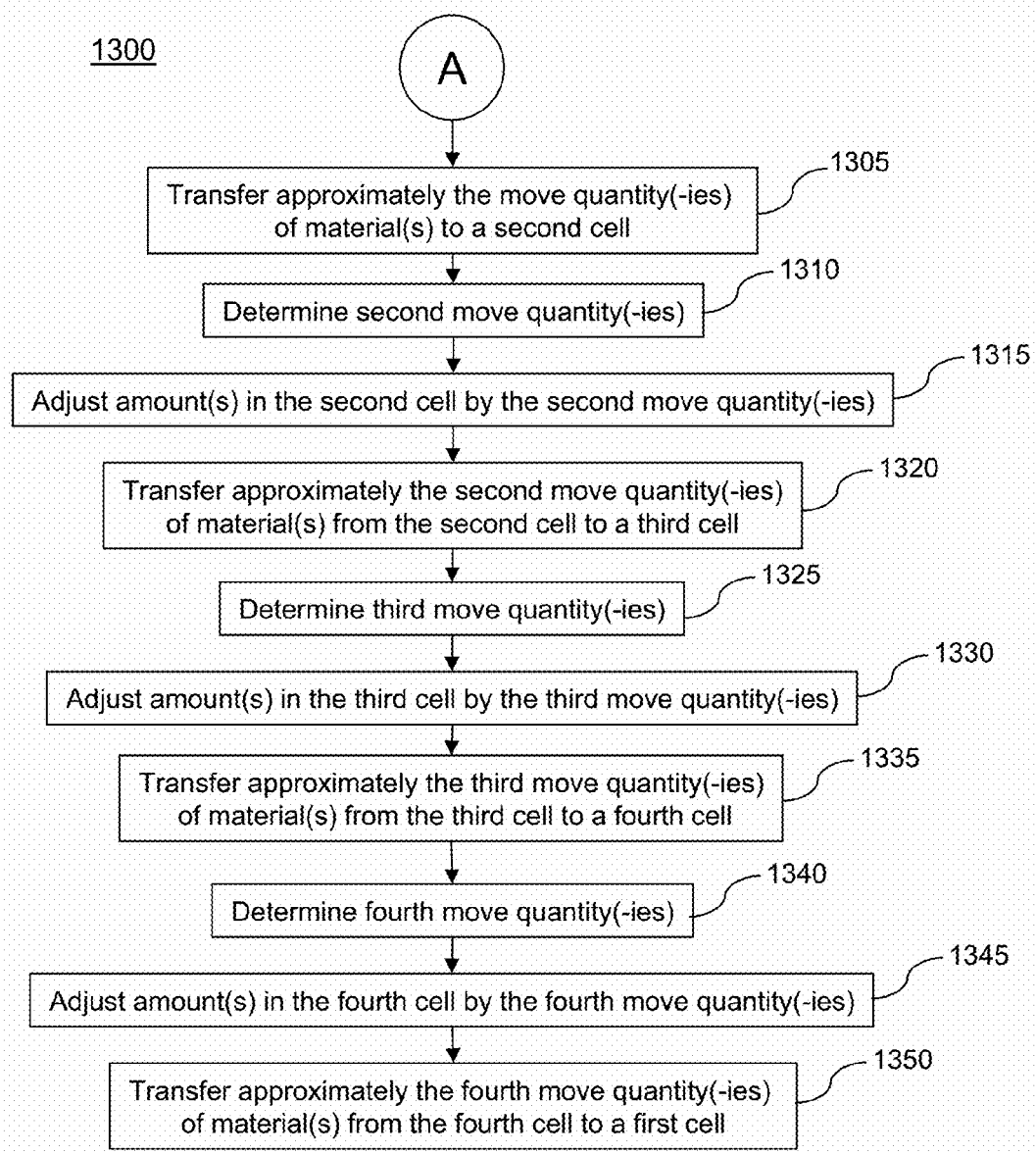

Referring now to FIG. 12, an illustrative method 1200 is provided for simulating and/or controlling a nuclear reactor. The method 1200 starts at a block 1210. As illustrated by point A, method 1200 may be preceded by method 1100.

At block 1210, approximately the move quantity(-ies) of the material(s) is/are transferred from/to a second cell. In this block, an actual amount of at least one substance corresponding to one or more of the at least one material is transferred from or to the location of the second (i.e., from the second cell location or to the second cell location). For example, in conjunction with block 1160 of method 1100, a quantity of a substance, approximately equal to the determined move quantity or quantities of the corresponding materials, may be transferred from the first cell to the second cell or vice versa.

The method stops at block 1210.

Referring now to FIG. 13, an illustrative method 1300 is provided for simulating and/or controlling a nuclear reactor. The method 1300 starts at a block 1305. As illustrated by point A, method 1300 may be preceded by method 1100. Illustrative method 1300 provides an exemplary method of moving matter in a four-cell loop through the reactor. At each cell in the loop, the amount and type of matter moved need not be identical. A person of skill in the art would understand that the four-cell loop may be expanded or contracted as suitable (i.e., include fewer or more cells).

At block 1305, approximately the move quantity(-ies) of material(s) is/are transferred to a second cell. For example, in conjunction with block 1160 of method 1100, a quantity of a substance, approximately equal to the determined move quantity or quantities of the corresponding materials, may be transferred from the first cell to the second cell.

At block 1310, second move quantity(-ies) is (are) determined. The second move quantity or quantities may be calculated in any way as described above.

At block 1315, amount(s) in the second cell is (are) adjusted by the second move quantity(-ies).

At block 1320, approximately the second move quantity(-ies) of material(s) are transferred from the second cell to a third cell.

At block 1325, third move quantity(-ies) is (are) determined.

At block 1330, amount(s) in the third cell is (are) adjusted by the third move quantity(-ies).

At block 1335, approximately the third move quantity(-ies) of material(s) is (are) transferred from the third cell to a fourth cell.

At block 1340, fourth move quantity(-ies) is (are) determined.

At block 1345, amount(s) in the fourth cell is (are) adjusted by the fourth move quantity(-ies).

At block 1350, approximately the fourth move quantity(-ies) of material(s) is (are) transferred from the fourth cell to a first cell The method stops at block 1350.

Figure 14:
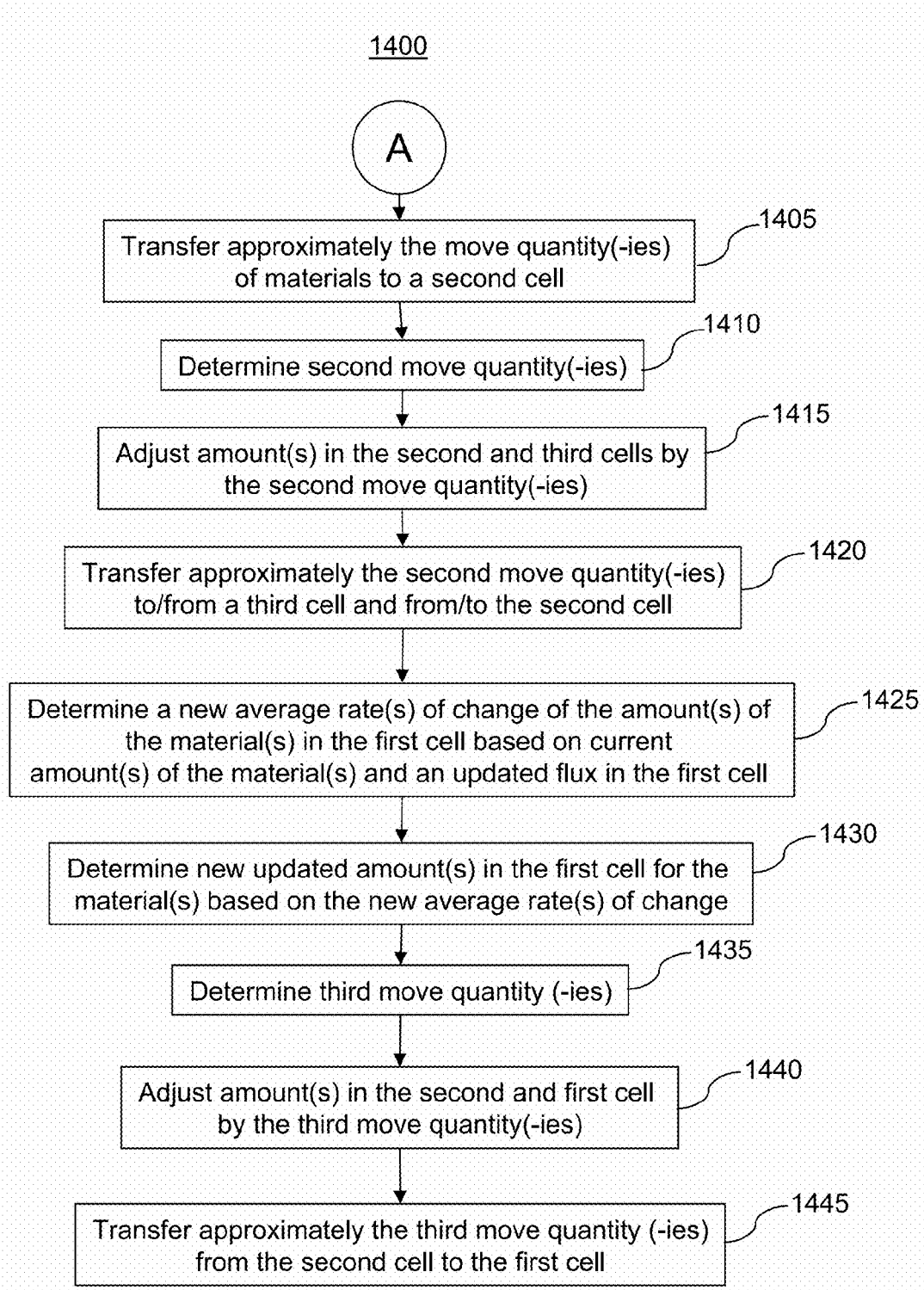

Referring now to FIG. 14, an illustrative method 1400 is provided for simulating and/or controlling a nuclear reactor. The method 1400 starts at a block 1405. As illustrated by point A, method 1400 may be preceded by method 1100. Illustrative method 1400 illustrates, inter alia, mixing quantities of one or materials from a first cell and a third cell, and transferring at least a portion of the mixture back to the first cell. One or more additional iterations of neutron flux and transmutation calculations may optionally occur. A person of skill in the art would understand that this illustrative method could be expanded or contracted to include various mixing methods using fewer or more cells.

At block 1405, approximately the move quantity(-ies) of materials is (are) transferred to a second cell.

At block 1410, second move quantity(-ies) is (are) determined.

At block 1415, amount(s) in the second and third cells is (are) adjusted by the second move quantity(-ies).

At block 1420, approximately the second move quantity(-ies) are transferred to/from a third cell and from/to the second cell.

At block 1425, a new average rate(s) of change of the amount(s) of the material(s) in the first cell based on current amount(s) of the material(s) and an updated flux in the first cell is (are) determined.

At block 1430, new updated amount(s) in the first cell for the material(s) is (are) determined based on the new average rate(s) of change.

At block 1435, third move quantity (-ies) is (are) determined.

At block 1440, amount(s) in the second and first cell is (are) adjusted by the third move quantity(-ies).

At block 1445, approximately the third move quantity (-ies) is (are) transferred from the second cell to the first cell.

The method stops at block 1445.

Figure 15:
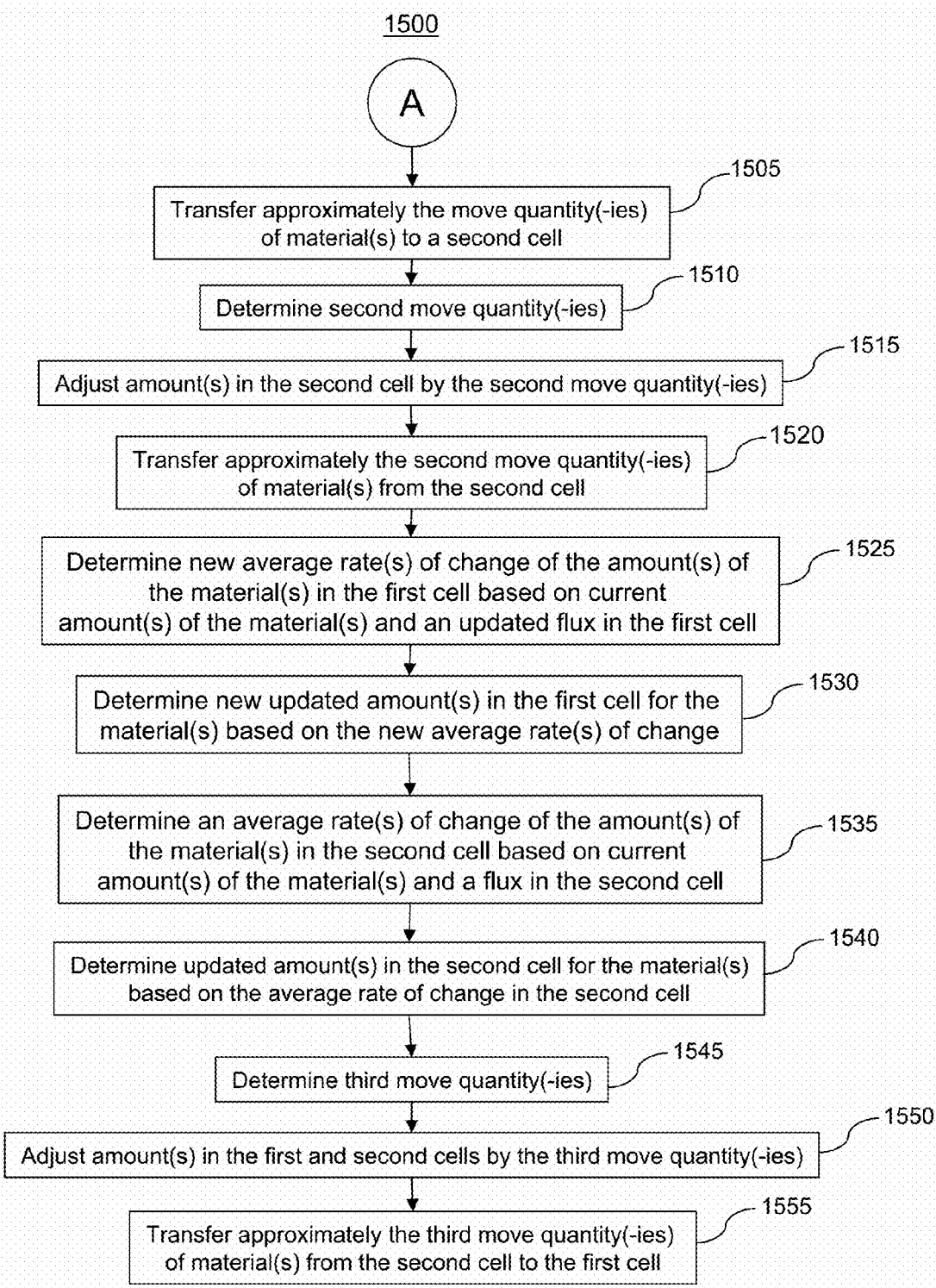

Referring now to FIG. 15, an illustrative method 1500 is provided for simulating and/or controlling a nuclear reactor. As illustrated by point A, method 1500 may be preceded by method 1100. Illustrative method 1500 provides an exemplary method of, inter alia, transferring quantities of one or more materials to a cell location for holding (e.g., a holding tank or reservoir, etc.). While the material is in the holding cell location, one or more additional iterations of neutron flux and transmutation calculations may optionally occur. Material may also be transferred out of the holding cell (e.g., to a location that is not represented by the first cell). A person of skill in the art would understand that this illustrative method could be expanded or contracted to include various holding methods using fewer or more cells. The method 1500 starts at a block 1505.

At block 1505, approximately the move quantity(-ies) of material(s) is (are) transferred to a second cell.

At block 1510, second move quantity(-ies) is (are) determined.

At block 1515, amount(s) in the second cell is (are) adjusted by the second move quantity(-ies).

At block 1520, approximately the second move quantity(-ies) of material(s) is (are) transferred from the second cell.

At block 1525, new average rate(s) of change of the amount(s) of the material(s) in the first cell is (are) determined based on current amount(s) of the material(s) and an updated flux in the first cell.

At block 1530, new updated amount(s) in the first cell for the material(s) is (are) determined based on the new average rate(s) of change.

At block 1535, an average rate(s) of change of the amount(s) of the material(s) in the second cell is (are) determined based on current amount(s) of the material(s) and a flux in the second cell.

At block 1540, updated amount(s) in the second cell for the material(s) is (are) determined based on the average rate of change in the second cell.

At block 1545, third move quantity(-ies) is (are) determined.

At block 1550, amount(s) in the first and second cells is (are) adjusted by the third move quantity(-ies).

At block 1555, approximately the third move quantity(-ies) of material(s) is (are) transferred from the second cell to the first cell.

The method stops at block 1555.

Figure 16:
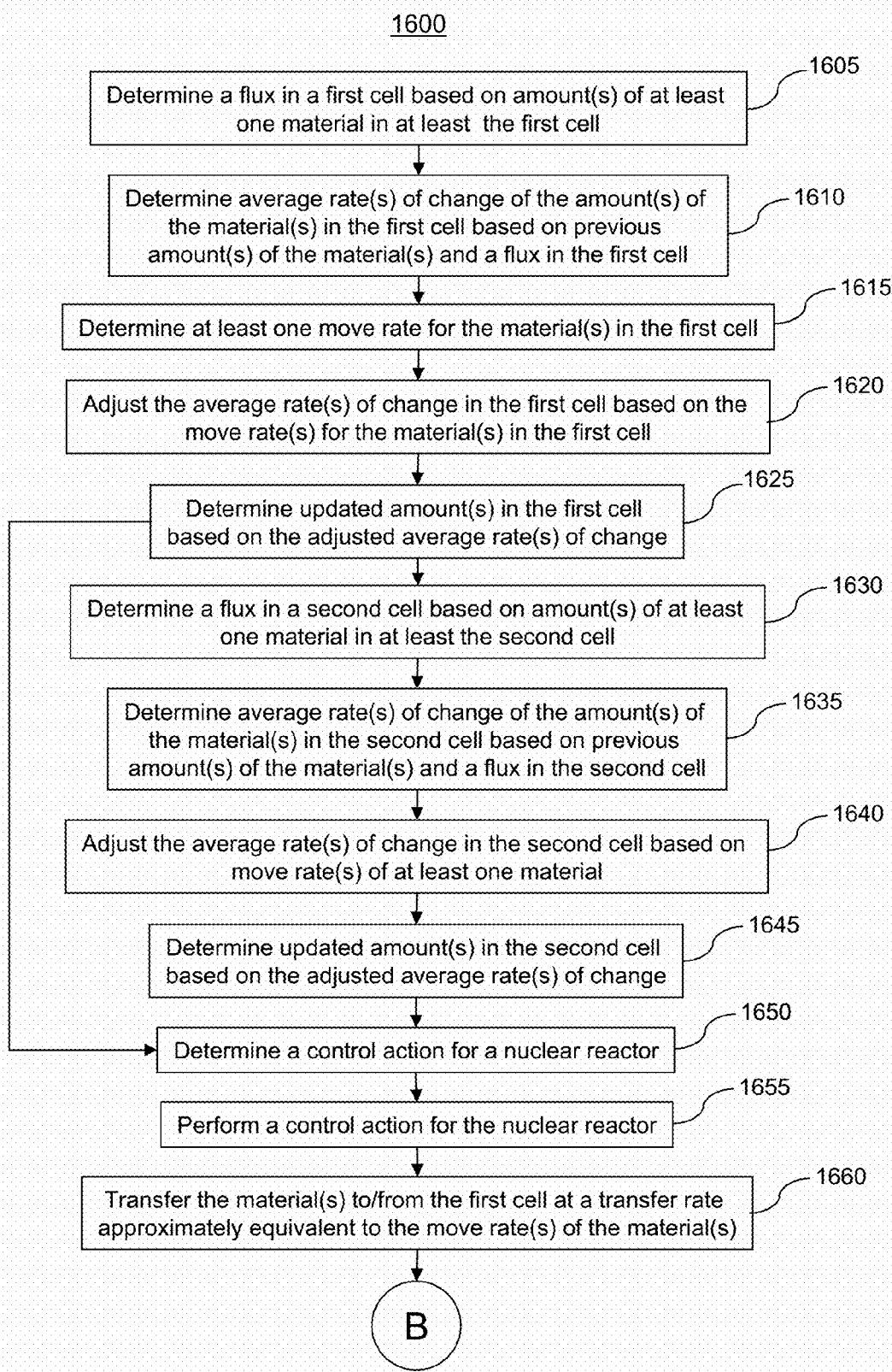

Referring now to FIG. 16, an illustrative method 1600 is provided for simulating and/or controlling a nuclear reactor. Illustrative method 1600 differs from illustrative method 1110, but some steps may be similar. For example, illustrative method 1600 provides an example of a continuous move of material(s) rather than discrete moves. The method 1600 starts at a block 1605.

At block 1605, a flux in a first cell is determined based on amount(s) of at least one material in the first cell. As discussed above, the flux determination may be further based on the amounts of more than one material in the first cell. Also, the flux determination may be further based on the amounts one or more materials in one or more other cells. This block is similar to block 1105.

At block 1610, average rate(s) of change of the amount(s) of the material(s) in the first cell is (are) determined based on previous amount(s) of the material(s) and a flux in the first cell. This block is similar to block 1110.

At block 1615, at least one move rate for the material(s) in the first cell is (are) determined. A move rate may be any rate of movement of one or more materials such as a quantity of a material that is desired to be moved into or out of a cell. In this block one or more move rates may each apply to one or more materials in the first cell. A move rate may be determined in response to one or more reactor parameters such as a flux or a fluence, a power level (local or overall), a temperature, etc. A reactor parameter may be compared to a threshold or set point for that parameter. This block may be repeated as suitable, e.g., for each of one or more materials in the first cell.

At block 1620, the average rate(s) of change in the first cell is (are) adjusted based on the move rate(s) for the material(s) in the first cell. For example, an average rate of change of a material in the first cell may be adjusted (increased or decreased) based on a determined move rate. The adjustment may be made to a single average rate of change or to individual rates of change which are averaged (e.g., in a straight average or a weighted average). The average rates of change for more than one material may be solved individually or simultaneously (such as when coupled through transmutation equations).

At block 1625, updated amount(s) in the first cell is (are) determined based on the adjusted average rate(s) of change. In an embodiment, a material may be moved outside the reactor. In this case, blocks 1630 through 1645 may be skipped.

At block 1630, a flux in a second cell is determined based on amount(s) of at least one material in the second cell. As discussed above, the flux determination may be further based on the amounts of more than one material in the first cell. Also, the flux determination may be further based on the amounts one or more materials in one or more other cells.

At block 1635, average rate(s) of change of the amount(s) of the material(s) in the second cell is (are) determined based on previous amount(s) of the material(s) and a flux in the second cell.

At block 1640, the average rate(s) of change in the second cell is (are) determined based on move rate(s) of at least one material.

At block 1645, updated amount(s) in the second cell is (are) based on the adjusted average rate(s) of change.

At block 1650, a control action for a nuclear reactor is determined. In an embodiment, this block is optional.

At block 1655, a control action for nuclear reactor is performed. In an embodiment, this block is optional.

At block 1660, material(s) is (are) transferred to/from the first cell at a transfer rate approximately equivalent to the move rate(s) of the material(s). As with block 1160, an actual amount of at least one substance is transferred, but the transfer is at a transfer rate equivalent to the appropriate move rate. In an embodiment such as a simulation or evaluation of a reactor design, this step is optional.

The method stops at block 1660, but may continue to point B as indicated in other methods in other figures.

Referring now to FIG. 17, an illustrative method 1700 is provided for simulating and/or controlling a nuclear reactor. The method 1700 starts at a block 1705. As illustrated by point B, method 1700 may be preceded by method 1600.

At block 1705, material(s) is (are) transferred from/to a second cell at the transfer rate(s) approximately equivalent to the move rate(s) of the materials. In this block, an actual of amount of at least one substance corresponding to one or more of the at least one material is transferred from or to the location of the second (i.e., from the second cell location or to the second cell location) at the move rate(s). For example, in conjunction with block 1660 of method 1600, a quantity of a substance, approximately equal to the determined move quantity or quantities of the corresponding materials, may be transferred from the first cell to the second cell or vice versa at the appropriate move rate(s).

The method stops at block 1705.

Referring now to FIG. 18, an illustrative method 1800 is provided for simulating and/or controlling a nuclear reactor. The method 1800 starts at a block 1805. As illustrated by point B, method 1800 may be preceded by method 1600. Illustrative method 1800 provides an exemplary method of moving matter at various rates in a four-cell loop through the reactor. At each cell in the loop, the rate and type of matter moved need not be identical. A person of skill in the art would understand that the four-cell loop may be expanded or contracted as suitable (i.e., include fewer or more cells).

At block 1805, material(s) is (are) transferred to the second cell at transfer rate(s) approximately equivalent to the move rate(s) of the materials.

At block 1810, a second (set of) move rate(s) for material(s) in the second cell is (are) determined.

At block 1815, further adjustment(s) to average rate(s) of change in the second cell is (are) made based on the second (set of) move rate(s) of the material(s).

At block 1820, material(s) is (are) transferred from the second cell to a third cell at approximately the second (set of) move rate(s).

At block 1825, move rate(s) for material(s) in the third cell is (are) determined.

At block 1830, average rate(s) of change for material(s) in the third cell is (are) adjusted by the second (set of) move rates for the second cell and/or the determined move rates of the third cell.

At block 1835, material(s) is (are) transferred from the third cell to a fourth cell at approximately the determined move rate(s) of the third cell.

At block 1840, move rate(s) for material(s) in the fourth cell is (are) determined.

At block 1845, average rate(s) of change for material(s) in the fourth cell is (are) adjusted by the determined move rate(s) of the third cell and/or the determined move rates of the fourth cell.

At block 1850, material(s) is (are) transferred from the fourth cell to the first cell at approximately the determined move rates of the fourth cell.

The method stops at block 1850.

Figure 19:
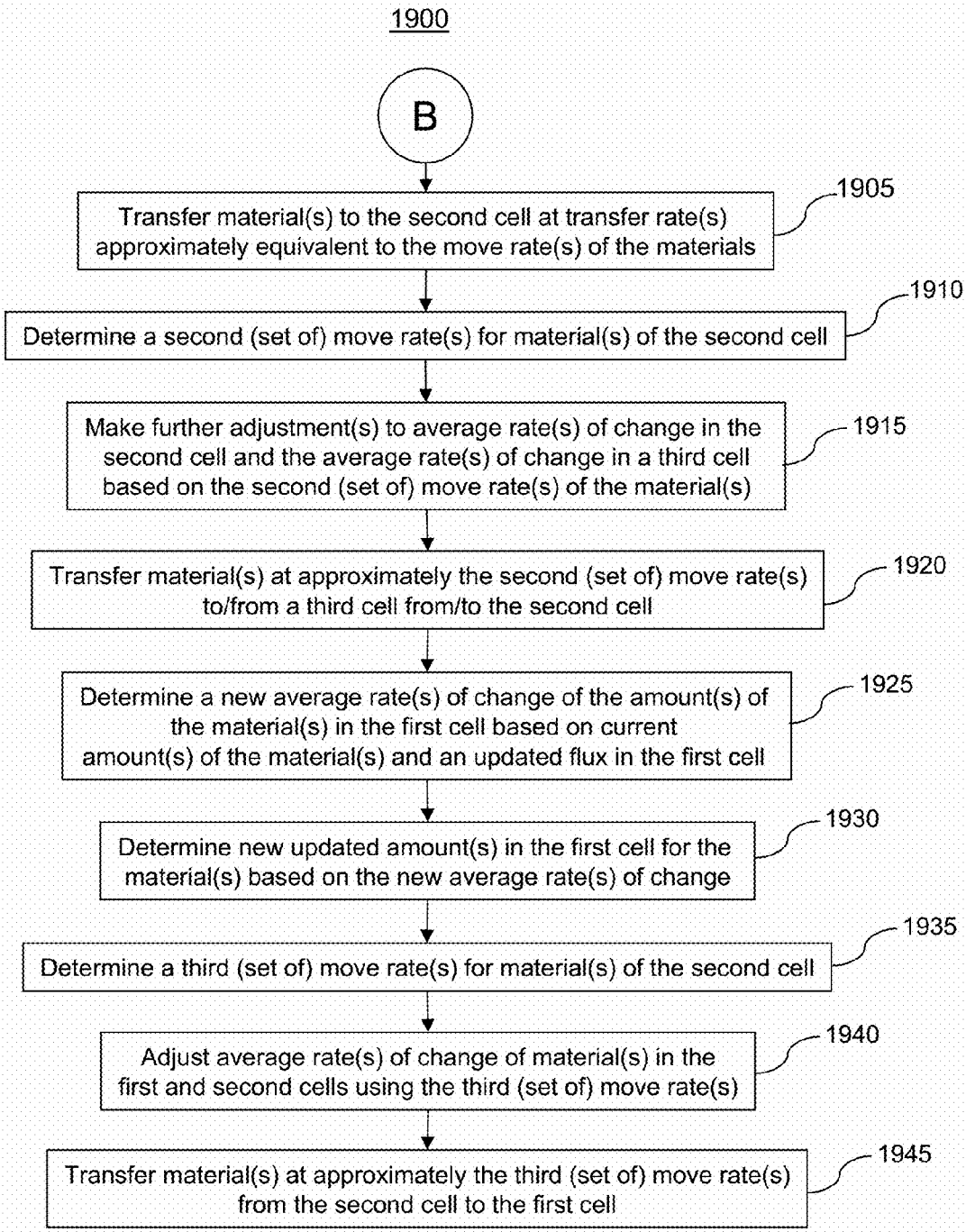

Referring now to FIG. 19, an illustrative method 1900 is provided for simulating and/or controlling a nuclear reactor. Illustrative method 1900 illustrates, inter alia, mixing quantities of one or materials from a first cell and a third cell, and transferring at least a portion of the mixture back to the first cell. The transfers occur at various rates. One or more additional iterations of neutron flux and transmutation calculations may optionally occur during the transfer. A person of skill in the art would understand that this illustrative method could be expanded or contracted to include various mixing methods using fewer or more cells. The method 1900 starts at a block 1905. As illustrated by point B, method 1900 may be preceded by method 1600.

At block 1905, material(s) is (are) transferred to the second cell at transfer rate(s) approximately equivalent to the move rate(s) of the materials.

At block 1910, a second (set of) move rate(s) for material(s) of the second cell is (are) determined.

At block 1915, further adjustments are made to average rate(s) of change in the second cell and to the average rate(s) of change in a third cell based on the second (set of) move rate(s) of the material(s).

At block 1920, material(s) is (are) transferred at approximately the second (set of) move rate(s) to/from a third cell from/to the second cell.

At block 1925, new average rate(s) of change of the amount(s) of the material(s) in the first cell is (are) determined based on current amount(s) of the material(s) and an updated flux in the first cell.

At block 1930, new updated amount(s) in the first cell for the material(s) is (are) determined based on the new average rate(s) of change.

At block 1935, a third (set of) move rate(s) is determined for material(s) of the second cell.

At block 1940, average rate(s) of change of material(s) in the first and second cells is (are) adjusted using the third (set of) move rate(s).

At block 1945, material(s) is (are) are transferred at approximately the third (set of) move rate(s) from the second cell to the first cell.

The method stops at block 1945.

Figure 20:
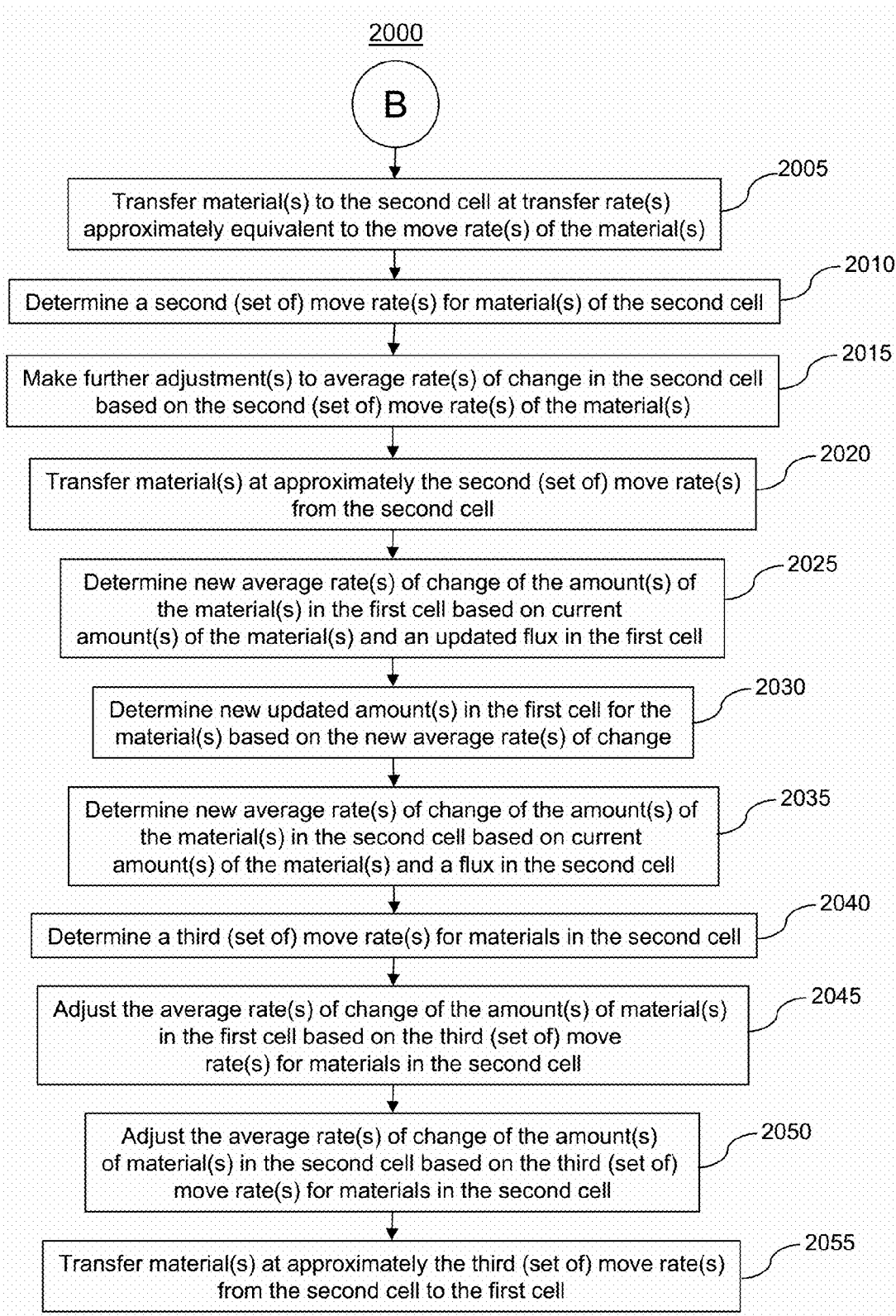

Referring now to FIG. 20, an illustrative method 2000 is provided for simulating and/or controlling a nuclear reactor. Illustrative method 2000 provides an exemplary method of, inter alia, transferring quantities of one or more materials to a cell location for holding (e.g., a holding tank or reservoir, etc.) at various rates. While the material is being transferred to/from the holding cell location, one or more additional iterations of neutron flux and transmutation calculations may optionally occur. Material may also be transferred out of the holding cell (e.g., to a location that is not represented by the first cell). The method 2000 starts at a block 2005. As illustrated by point B, method 2000 may be preceded by method 1600.

At block 2005, material(s) is (are) transferred to the second cell at transfer rate(s) approximately equivalent to the move rate(s) of the materials.

At block 2010, a second (set of) move rate(s) for material(s) of the second cell is determined.

At block 2015, further adjustment(s) is (are) made to average rate(s) of change in the second cell based on the second (set of) move rate(s) of the material(s).

At block 2020, material(s) is (are) transferred at approximately the second (set of) move rate(s) from the second cell.

At block 2025, new average rate(s) of change of the amount(s) of the material(s) in the first cell is (are) determined based on current amount(s) of the material(s) and an updated flux in the first cell.

At block 2030, new updated amount(s) in the first cell is (are) determined for the material(s) based on the new average rate(s) of change.

At block 2035, new average rate(s) of change of the amount(s) of the material(s) in the second cell is (are) determined based on current amount(s) of the material(s) and a flux in the second cell.

At block 2040, a third (set of) move rate(s) for materials in the second cell is determined.

At block 2045, the average rate(s) of change of the amount(s) of material(s) in the first cell is (are) determined based on the third (set of) move rate(s) for materials in the second cell.

At block 2050, the average rate(s) of change of the amount(s) of material(s) in the second cell is (are) determined based on the third (set of) move rate(s) for materials in the second cell.

At block 2055, material(s) is (are) transferred at approximately the third (set of) move rate(s) from the second cell to the first cell.

The method stops at block 2055.

Figure 21:
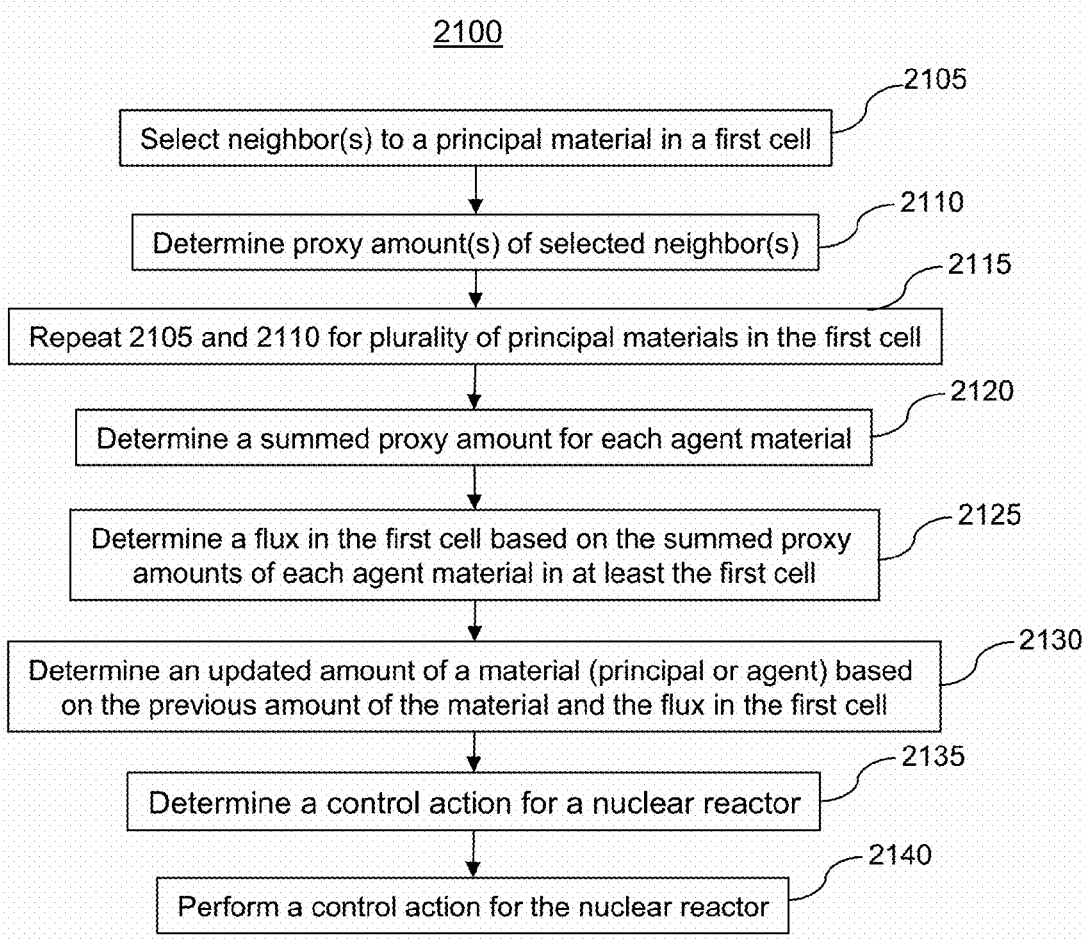

Referring now to FIG. 21, an illustrative method 2100 is provided for simulating and/or controlling a nuclear reactor. As discussed elsewhere herein, neutron transport equations may use cross sectional data for some or all of the materials in the reactor. Method 2100 illustrates a non-limiting example method that may have one or more of the following benefit. It may reduce the computational burden, reduce the need for exhaustive cross sectional data for each reaction for each target particle across a spectrum of incident particle energies, and/or improve accuracy of current methods. The method 2100 starts at a block 2105.

At block 2105, a neighbor to a principal material in a first cell is selected. A principal material is a material of one or more materials in a reactor or reactor cell that may be represented by an agent material. In an embodiment, principal materials may be fission products (elements, isotopes, and/or isomers of isotopes). A principal material might not be well-characterized with respect to a microscopic property such as microscopic cross sectional data. For example, some of the cross sections for scattering, radiative capture, fission, etc. reactions with neutrons of various energies may not be known. Also, the principal's information may be well-known, but for other reasons (such as reducing computational burden), the principal material may be represented by a neighbor material which will act as an agent. The neighbor may be selected from a plurality of agent materials. In an embodiment, multiple neighbors may be selected from the plurality of agent materials to represent the principal material as agents for more than one property. Agent materials are typically well-characterized with regard to pertinent microscopic cross sectional data. In an embodiment, agent materials are actual materials (e.g, isotopes) with empirically determined microscopic quantities. In a further embodiment, agent materials include one or more fictional materials. A fictional material is essentially a collection of fictional values for various cross sections and optionally other properties. A neighbor may be chosen to act as the agent for the principal on one or more of many criteria. Typically, a neighbor has microscopic properties such that a certain density of the neighbor will have similar macroscopic properties as the existing density of the principal. Thus, a neighbor may be selected to act as an agent for the principal based on a comparison of microscopic properties of the principal to the microscopic properties of each of the neighbors. Microscopic properties may be approximated having one or more discrete values with respect to incident particle (e.g., neutron) energy, or may be evaluated as a function of incident particle energy. In an embodiment, the selection of a neighbor or neighbors is limited to a selection from one or more agent materials that are also fission products of the fissions of one or more fissile materials. The fission products may further be limited to fissions induced by neutrons and/or neutrons of certain energy levels. In an embodiment further limiting the selection, potential neighbors may be chosen from agent materials under the same "hump" as the principal material of a fission yield curve (e.g., left curve portion 912 or right curve portion 914 of fission yield curve 900 illustrated in FIG. 9). In an embodiment, the number of potential principal materials is larger than the number of agent materials. For example, the known fission product isotopes number in the thousands. In a further embodiment, the number of agent materials is limited to a relatively small number (e.g., under 100, 50, 30, or 20). In an embodiment, the number of agent materials is limited to 12. In an embodiment, this block is performed by exemplary method 2200 described below.

At block 2110, a proxy amount of the selected neighbor or neighbors is determined. As discussed above, a neighbor might have microscopic properties such that a certain density of the neighbor will have similar macroscopic properties as the existing density of the principal. The proxy amount is the amount or density (e.g., concentration) of the neighbor that will serve to represent the principal in a given concentration. As with microscopic properties, macroscopic properties may be approximated as one or more discrete values or as a function of incident particle energy.

At block 2115, blocks 2105 and 2110 are repeated for each of a plurality of principal materials in the first cell. In this block, a neighbor or neighbors is/are selected to act as an agent(s) for each of the plurality of principal materials (which may or may not make up all of the materials in the cell). A given agent material may be selected as a neighbor for more than one principal material. Other agent materials may not be selected to be any principal's neighbor. Proxy amounts of each agent are determined for each principal to which the agent is a neighbor.

At block 2120, a summed proxy amount for each agent material is determined. In this block, a total proxy amount of each agent is determined based on the proxy amounts for each neighbor of the agent material. For example, suppose an agent material was selected to be the neighbor of three different principal materials. After performance of the previous blocks, the agent may have three proxy amounts (one for each principal). In this block, a summed proxy amount is determined based on the three proxy amounts (e.g., by summing them).

At block 2125, a flux in the first cell is determined based on the summed proxy amounts of each agent material the first cell. As described elsewhere herein, for example, a flux may be determined by a transport calculation (e.g., solving neutron transport equations to determine a neutron flux) and may be further based on the summed proxy amounts of each agent material in one or more other cells. The flux may be approximated by one or more discrete values, or may be a continuous function, thus describing a flux spectrum. The flux may be space and/or energy dependent. The flux may be determined by numerical analysis methods including Monte Carlo methods. The average rate of change of the flux may be a weighted average (e.g., as determined by a Runge Kutta method or any other method). The flux may be dependent upon the amount of each of one or more materials in the first cell. Instead of using the actual amounts (e.g., concentrations) of each material in the cell, the calculation instead uses the summed proxy amounts of each agent material. Thus, the cross sectional data and concentrations of the principal materials are accounted for in a flux determination (e.g., neutron transport calculations) by agents having proxy concentrations. In embodiments where the number of agents is relatively small, the computational burden may be reduced significantly.

At block 2130, an updated amount of one or more materials (principal or agent) is determined based on the previous amount of the materials and the flux (e.g., the estimated average flux) in the first cell. The one or more materials may be a subset of the materials in the cell. For example, updated amounts may be determined by a transmutation calculation, which may take into account production rates (e.g., based on reactions rates such as fission rates) and decay rates (e.g., using decay constants). The updated amounts for the one or more materials may be solved individually or simultaneously (such as when coupled through transmutation equations). The calculation may include calculating the updated amount based on a specified length of time.

At block 2135, a control action for a nuclear reactor is determined. As described above, the control action may be a change (positive or negative) to a local neutronic reactivity of a reactor using any neutron affecting or absorbing features such as movement of neutron absorbing materials or fluids, control rods, etc.; a change in one or more various flow rates for any reason including but not limited to localized or overall reactor power, e.g., the flow of heat absorbing material (e.g., coolant) through the reactor or portions of the reactor by ordering changes in reactor coolant pump operation and/or various valve positions in the reactor system, including but not limited to reactor closures or reactor coolant shutoff valves, steam shutoff valves, etc.; a change in one or more breaker positions (e.g., reactor coolant pump power supply breakers, steam turbine-generator output breakers, etc.); or the like. Other control actions will be apparent to persons skilled in the art based on the teachings herein. The determined control action may be displayed to a user.

At block 2140, a control action for the nuclear reactor is performed. As described above, this performance may be automatic or manual.

The method stops at block 2140.

Figure 22:
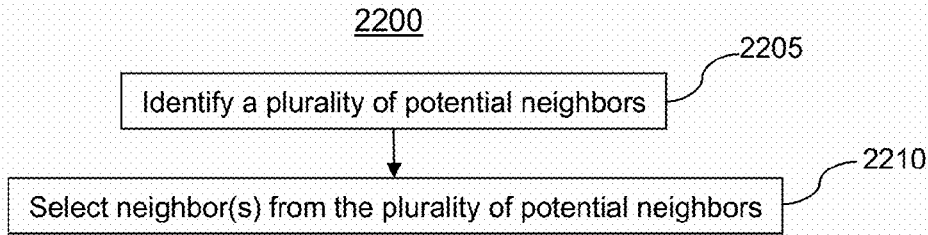

Referring now to FIG. 22, an illustrative method 2200 is provided for simulating and/or controlling a nuclear reactor. In an embodiment, method 2200 is used to perform block 2105 above. The method 2200 starts at a block 2205.

At block 2205, a plurality of potential neighbors is identified. Continuing the description of block 2205, potential neighbors may be limited to materials that are fission products of certain isotopes, perhaps induced by incident particles of a certain energy. In an embodiment, potential neighbors for a given principal may be limited to fission products under the same "hump" of a fission yield curve or curves as the principal. The fission yield curve of interest might be, for example, the curve of one particular fissile material's fission reaction or the curves of multiple fission reactions in any combination of incident particle energy and fissile material. Potential neighbors may also be limited to materials which are characterized to the extent necessary to be suitable as agent materials. In an embodiment, the plurality of potential neighbors for a given principal is chosen by identifying some number (e.g., three) of agent materials having atomic mass numbers (A) "most similar" to that of the principal material. The "most similar" decision may be restricted to agent materials having larger (or smaller) atomic mass numbers. Also, the "most similar" decision may be forced to take at least one smaller and one larger (in atomic mass number) agent material. Potential neighbors having a microscopic cross section of zero or close to zero may be ruled out in some embodiments.

At block 2210, a neighbor is selected from the plurality of potential neighbors. Once a plurality of potential neighbors is identified, one or more neighbors may be selected from the plurality. In an embodiment, neighbors may be selected by comparing one or more microscopic properties such as a cross section. Thus, the number of comparisons needed to select a neighbor is limited by the number of materials determined to be potential neighbors in block 2205.

The method stops at block 2210. In an embodiment, potential neighbors may be identified by comparing one or more microscopic properties such as a cross section. Potential neighbors having a microscopic cross section of zero or close to zero may be ruled out in some embodiments.

CONCLUSION

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." With respect to the appended claims, those skilled in the art will appreciate that recited operations therein may generally be performed in any order. Examples of such alternate orderings may include overlapping, interleaved, interrupted, reordered, incremental, preparatory, supplemental, simultaneous, reverse, or other variant orderings, unless context dictates otherwise. With respect to context, even terms like "responsive to," "related to," or other past-tense adjectives are generally not intended to exclude such variants, unless context dictates otherwise.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", "operatively coupled," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for determining respective amounts of materials in a first cell, said first cell including a plurality of principal materials, the method comprising:
   (a) selecting a neighbor to a principal material in said first cell, wherein said selected neighbor is one of a plurality of agent materials;
   (b) determining a proxy amount of said selected neighbor for said first cell, wherein said proxy amount represents an amount of said selected neighbor that approximates a macroscopic property of said principal material as a function of an amount of said principal material in said first cell;
   (c) performing acts (a) and (b) for each principal material of the plurality of principal materials in said first cell; and
   (d) determining a summed proxy amount of each agent material for said first cell by summing agent material proxy amounts associated with said each agent material.

2. The method of claim 1, wherein an agent material of the plurality of agent materials is an isotope having a plurality of acceptably characterized microscopic properties of interest.

3. The method of claim 1, wherein an agent material of the plurality of agent materials is a fictional material having fictional values for a plurality of microscopic properties of interest.

4. The method of claim 1, wherein a principal material is an isotope having at least one microscopic property that is not acceptably characterized.

5. The method of claim 1, wherein a number of acceptably characterized microscopic properties of at least one agent material is larger than a number of acceptably characterized microscopic properties of at least one principal material.

6. The method of claim 1, wherein agent materials and principal materials include fission products.

7. The method of claim 1, wherein a first cell corresponds to a region of a plurality of regions of a nuclear reactor system.

8. The method of claim 1, wherein a first cell corresponds to a region of a plurality of regions of a simulated nuclear reactor system.

9. The method of claim 1, wherein a first cell corresponds to a region of a plurality of regions of an existing nuclear reactor system.

10. The method of claim 1, wherein a first cell corresponds to a region of a plurality of regions of a currently operating nuclear reactor system.

11. The method of claim 1, wherein said first cell corresponds to region having a homogeneous composition of materials.

12. The method of claim 1, wherein said first cell corresponds to a region including a heterogeneous composition of materials.

13. The method of claim 1, further comprising performing acts (a)-(d) for each cell of a plurality of cells.

14. The method of claim 13, wherein said first cell corresponds to a region having a first shape different than a second shape of a second region corresponding to a second cell of said plurality of cells.

15. The method of claim 13, wherein said first cell corresponds to a first region having a first volume different than a second volume of a second region corresponding to a second cell of said plurality of cells.

16. The method of claim 1, wherein act (d) comprises determining summed proxy amounts for a plurality of agent materials.

17. The method of claim 1, wherein act (a) comprises selecting said neighbor from among a plurality of potential neighbors based on a comparison of a microscopic property of said principal material with a microscopic property of each of said plurality of neighbors.

18. The method of claim 17, further comprising identifying said plurality of potential neighbors from among said agent materials based on a comparison of an atomic mass number (A) of said principal material with an A of each of said agent materials.

19. The method of claim 17, wherein said microscopic property is a microscopic absorption cross section.

20. The method of claim 19, further comprising approximating said microscopic absorption cross section with a single value based on a neutron flux spectrum.

21. The method of claim 19, further comprising approximating said microscopic absorption cross section based on a function of a neutron flux spectrum.

22. The method of claim 19, further comprising approximating said microscopic absorption cross section based on an integral of a function of a microscopic absorption cross section weighted by a neutron flux spectrum.

23. The method of claim 17, wherein said microscopic property is a microscopic scattering cross section.

24. The method of claim 23, further comprising approximating said microscopic scattering cross section with a single value based on a neutron flux spectrum.

25. The method of claim 23, further comprising approximating said microscopic scattering cross section based on a function of a neutron flux spectrum.

26. The method of claim 1, wherein said macroscopic property is a macroscopic absorption cross section.

27. The method of claim 1, wherein said macroscopic property is a macroscopic scattering cross section.

28. The method of claim 1, wherein act (a) comprises selecting an agent material from among a plurality of fission products.

29. The method of claim 1, wherein act (a) comprises selecting an agent material from among a plurality of fission products in a peak of a fission product yield curve containing said principal material.

30. The method of claim 1, wherein a potential neighbor having a microscopic property of approximately zero is ignored.

31. The method of claim 1, wherein act (d) comprises adding an amount of said each agent material to a sum of proxy amounts associated with said each agent material.

32. The method of claim 1, further comprising:
   (e) determining a flux in said first cell based on said summed proxy amounts of said each agent material in said first cell.

33. The method of claim 32, wherein said determining of act (e) is further based on one or more summed proxy amounts of one or more agent materials in a second cell.

34. The method of claim 32, wherein said determining of act (e) is further based on one or more summed proxy amounts of one or more agent materials in a plurality of cells.

35. The method of claim 32, further comprising determining a neutron flux spectrum.

36. The method of claim 32, wherein act (e) comprises determining said flux using a Monte Carlo method.

37. The method of claim 1, further comprising:
(e) determining an updated amount of one of said materials based on an amount of said one of said materials and a flux in said first cell.

38. The method of claim 1, further comprising:
moving a neutron absorber in a nuclear reactor system.

39. The method of claim 1, further comprising:
automatically moving a neutron absorber in a nuclear reactor system.

* * * * *